(12) United States Patent
Ousugi et al.

(10) Patent No.: US 7,944,651 B2
(45) Date of Patent: May 17, 2011

(54) CPP-TYPE MAGNETORESISTIVE EFFECT HEAD AND METHOD OF MANUFACTURING THE SAME

(75) Inventors: Masahiro Ousugi, Kanagawa (JP); Kouji Okazaki, Kanagawa (JP); Satoru Okamoto, Kanagawa (JP); Katsuro Watanabe, Ibaraki (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 804 days.

(21) Appl. No.: 12/006,723

(22) Filed: Jan. 4, 2008

(65) Prior Publication Data

US 2008/0239585 A1    Oct. 2, 2008

(30) Foreign Application Priority Data

Jan. 4, 2007   (JP) ................................ 2007-000122

(51) Int. Cl.
    *G11B 5/127*    (2006.01)
(52) U.S. Cl. .................................... 360/324.1
(58) Field of Classification Search ............... 360/324.1, 360/324.12, 324.11, 324.2, 319
    See application file for complete search history.

(56) References Cited

U.S. PATENT DOCUMENTS

| 6,858,909 B2 | 2/2005 | Cyrille et al. |
| 6,917,088 B2* | 7/2005 | Takahashi et al. ............ 257/422 |
| 2003/0034324 A1* | 2/2003 | Ueda et al. ..................... 216/22 |
| 2004/0004261 A1* | 1/2004 | Takahashi et al. ............ 257/414 |

FOREIGN PATENT DOCUMENTS

| JP | 02-017643 A | 1/1990 |
| JP | 2004-342154 A | 12/2004 |

* cited by examiner

*Primary Examiner* — Allen T Cao
(74) *Attorney, Agent, or Firm* — Patterson & Sheridan, LLP

(57) ABSTRACT

Embodiments of the present invention help to prevent a reduction in the bias magnetic field of a current perpendicular to the plane-type (CPP-type) magnetoresistive effect head, thus suppressing a reduction in read output. According to one embodiment, a CPP-type magnetoresistive effect film is formed on top of a lower magnetic shield. A refill insulation film and a magnetic domain control layer are formed on both sides of an intermediate layer and a free layer of the CPP-type magnetoresistive effect film. A side wall protection film is formed on a side wall of the refill insulation film and on top of the free layer so as to define the height of the magnetic domain control layer. To increase the film thickness of the magnetic domain control layer, the magnetic domain control layer and the refill insulation film are higher than the top surface of the free layer. A magnetic shield underlayer film is formed on the top surfaces of the free layer, the magnetic domain control layer and the refill insulation film and an upper magnetic shield layer is formed on the magnetic shield underlayer film.

14 Claims, 22 Drawing Sheets

Fig. 2

|  | Al | Co | Cr | Hf | Ir | Ni | Mg | Mo |
|---|---|---|---|---|---|---|---|---|
| CMP Polishing Rate (nm/min) | 40.5 | 4.6 | 4.8 | 3.3 | 2.1 | 20.4 | 31.2 | 3.5 |
| Vickers Hardness (Hv) | 18 | 124 | 130 | 160 | 200 | 60 | 36 | 160 |

|  | Nb | Re | Rh | Ru | Ta | W | Y | Zr |
|---|---|---|---|---|---|---|---|---|
| CMP Polishing Rate (nm/min) | 12.8 | 3.3 | 4.4 | 2.2 | 34.8 | 1.1 | 29.6 | 25.5 |
| Vickers Hardness (Hv) | 80 | 200 | 120 | 350 | 70 | 310 | 38 | 60 |

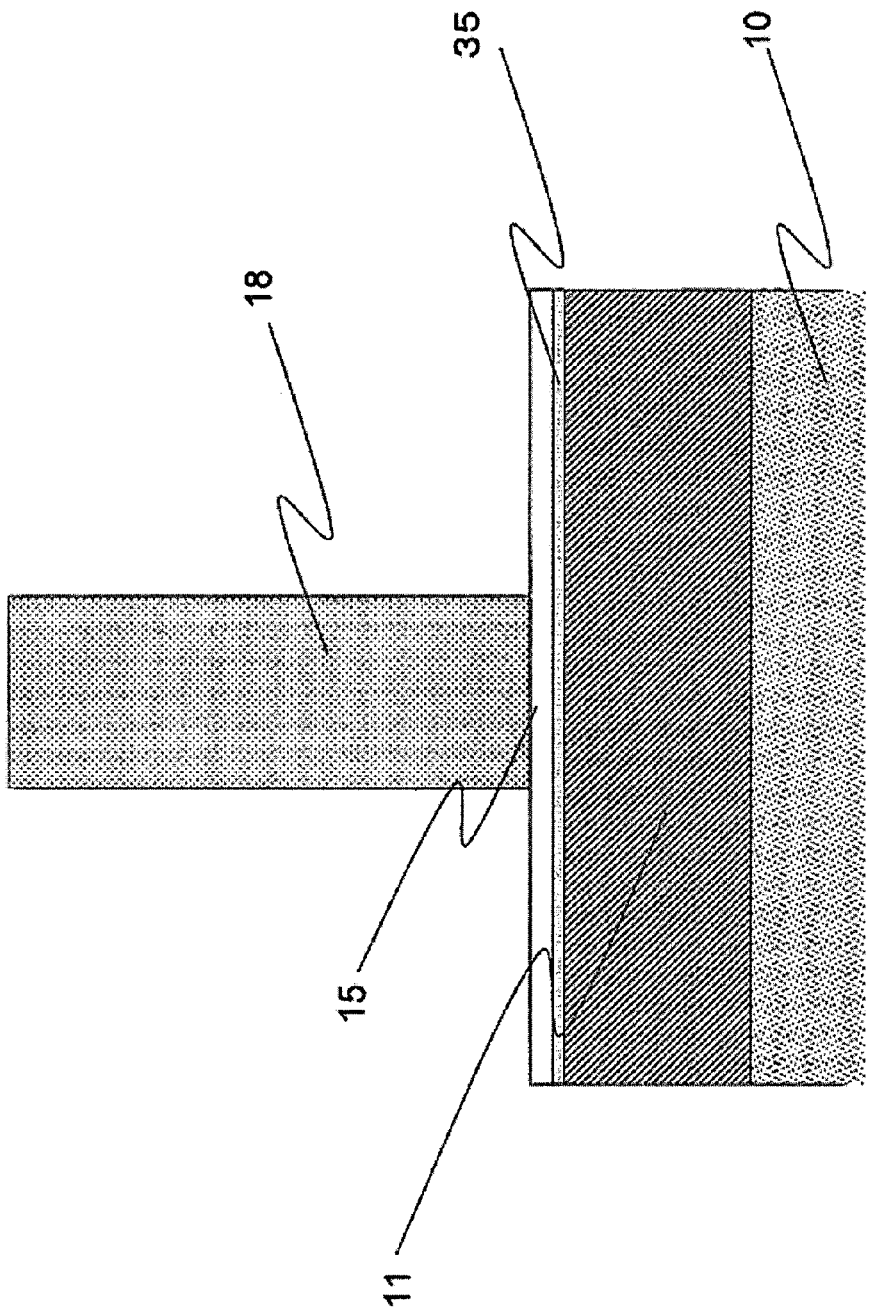

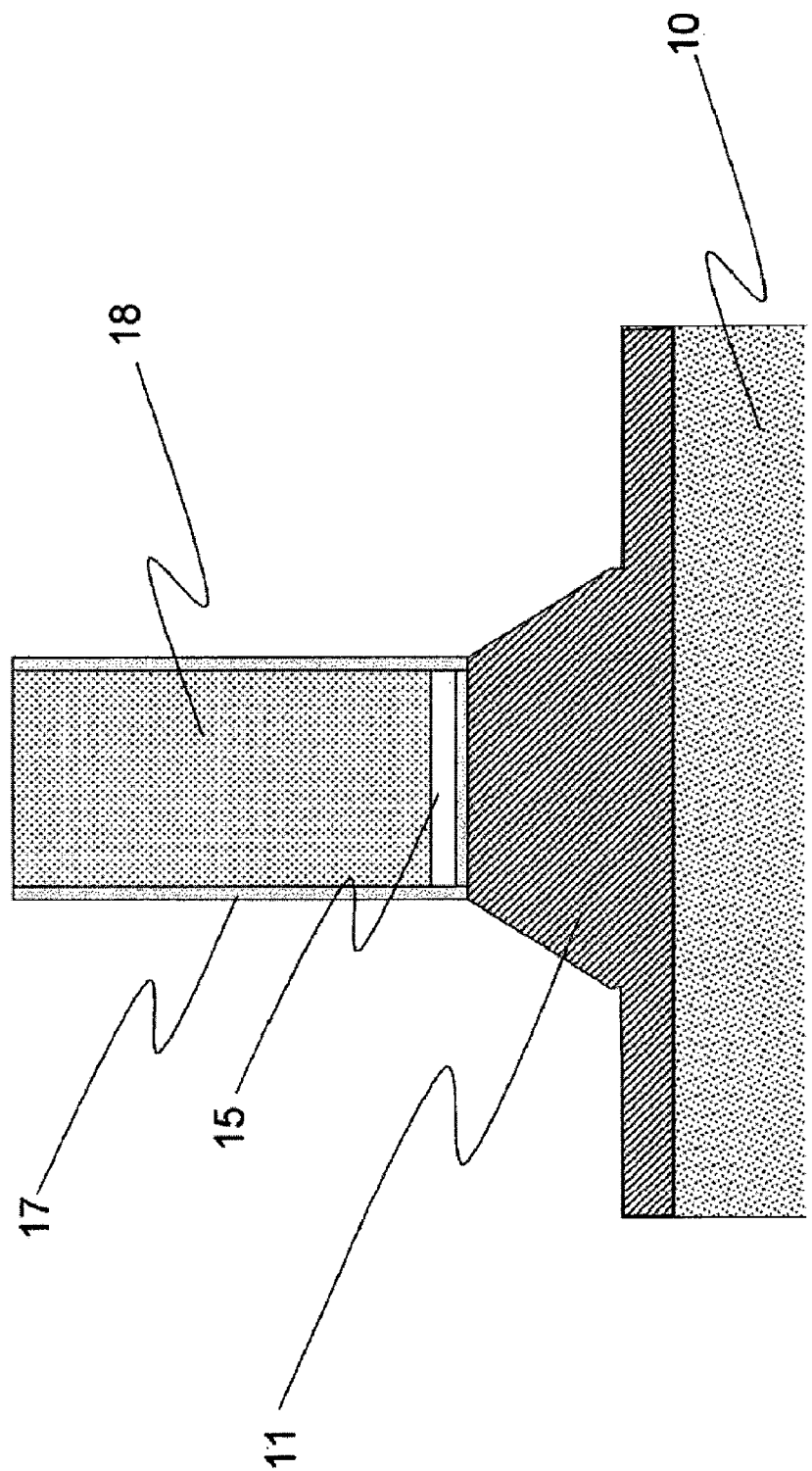

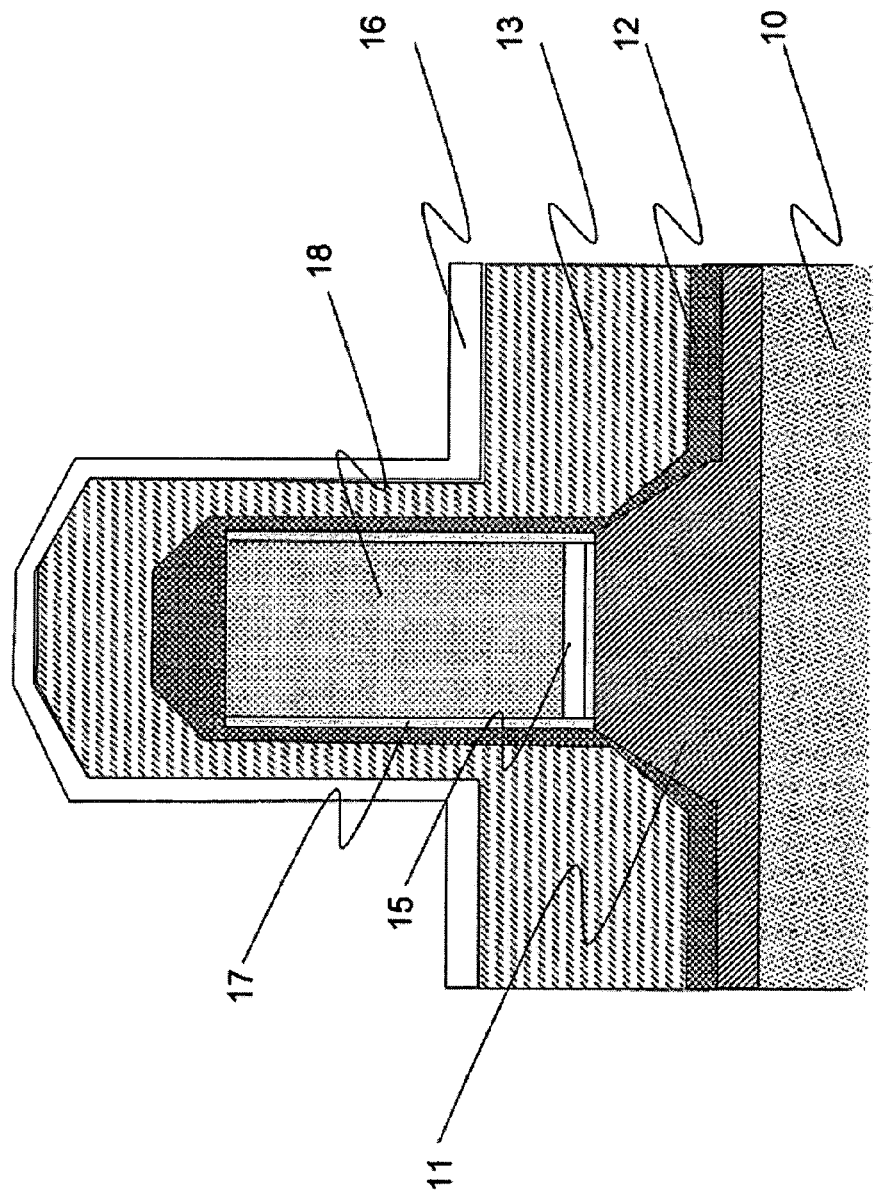

CPP-TYPE MAGNETORESISTIVE EFFECT HEAD AND METHOD OF MANUFACTURING THE SAME

CROSS-REFERENCE TO RELATED APPLICATION

The instant nonprovisional patent application claims priority to Japanese Patent Application No. 2007-000122 filed Jan. 4, 2007 and which is incorporated by reference in its entirety herein for all purposes.

BACKGROUND OF THE INVENTION

Magnetic recording apparatuses represented by hard disk drives are expected to provide a largely increased amount of storage in response to the recent advancement of information in society. In order to provide a largely increased amount of storage, it is necessary to increase recording density per unit area of the magnetic recording apparatus. The improvements of the high-sensitive technique of a read element using a magnetoresistive effect and of the track width-narrowing technique have been advanced.

For a low recording density of several Gb/in2, an anisotropic magnetoresistive effect (AMR) is used to convert a magnetic signal on a recording medium into an electric signal. For a high recording density in excess of several Gb/in2, a read element using higher-sensitive giant magnetoresistive effect (GMR) has been used. However, along with the further advancement of high recording density, it is essential to use a high-sensitive read element of a current perpendicular to the plane-type (CPP-type) GMR (CPP-GMR) or of a tunneling magnetoresistive effect (TMR). In addition, to narrow a track width, the development of technology for narrowing the size of resist through exposure conditions has been advanced in mask pattern formation.

The basic structure of a CPP-type magnetoresistive effect head is shown in FIG. 11, which is a cross-sectional view of a read element as from the direction of an air-bearing surface. The CPP-type magnetoresistive effect head includes a magnetoresistive effect film including a free layer 31 and a pinned layer 33 both made of alloy containing a ferromagnetic body, an antiferromagnetic layer 34 adapted to fix the magnetizing direction of the pinned layer 33 and an intermediate layer 32 made of a nonmagnetic material sandwiched between the free layer and the pinned layer; magnetic shield layers 14 and 10 disposed on and below, respectively, the magnetoresistive effect film 11 and serving as electrodes; a refill insulation film 12 adapted to electrically insulate the electrode; and a magnetic domain control layer 13 adapted to control the magnetizing direction of the free layer 31 through the refill insulation film 12.

The free layer 31 varies its magnetizing direction in response to a magnetizing direction input from the magnetization information recorded in a recording medium. When the free layer 31 varies its magnetizing direction, the resistance of a magnetic sensor portion is changed in response to a difference between the magnetizing direction of the free layer and that of the pinned layer. A hard disk drive is configured to convert the change of the resistance into an electric signal and read it. Thus, it is necessary to apply the electric current to read the resistance change of the magnetic sensor portion and the upper and lower magnetic shield layers 14, 10 also serve as electrode films.

The magnetic domain control layer 13 is configured to be disposed as close to the ends of the free layer as possible and to apply a bias magnetic field to the free layer 31. This is because of the following. The magnetizing direction of the free layer 31 is changed in sensitive response to an imperceptible recording magnetic field of information recorded in the recording medium. Application of the bias magnetic field is needed to ensure the reproducibility and stability of the initial magnetizing state and a magnetizing state changed when the recording magnetic field is inputted. Specifically, the free layer 31 which executes magnetization rotation upon receipt of a magnetic field from the magnetic recording medium may have multiple magnetic domains instead of a single magnetic domain structure. In this case, when a recording magnetic field is inputted, magnetic domain wall movement occurs, which causes various noise such as Barkhausen noise. In addition, the reproducibility of the initial magnetization state and the magnetization state at the time of magnetization is lost, which appears as a phenomenon such as output fluctuations. Consequently, the quality of a read signal is deteriorated. To bring the multiple magnetic domains of this free layer into a single magnetic domain structure, a bias magnetic field is applied to the free layer.

The track-width formation process of a CPP-type read element uses a lift-off method as described in Japanese Patent Publication No. 2-17643 ("Patent Document I"). A T-shaped resist pattern is formed on a magnetoresistive effect film formed on a lower electrode. The magnetoresistive effect film is patterned by ion milling using the T-shaped resist pattern as a mask. Thereafter, a refill insulation film and a magnetic domain control layer are formed with the T-shaped resist pattern left, and the T-shaped resist pattern is removed. At this time, a width of a dent called an under-cut at the skirt of the T-shaped resist pattern is controlled, whereby the refill insulation film and the magnetic domain control layer become a discontinuous film. The refill insulation film and the magnetic domain control layer formed on the resist pattern are removed along with the resist-solving process. Thereafter, an upper electrode is formed thereon.

However, in the case of intending to fabricate an element with a track width of less than 100 nm, even if the narrow mask pattern can be formed by advanced exposure technology, it becomes difficult to control the under-cut, which poses a problem in that the lift-off cannot be performed.

Japanese Patent Publication No. 2004-342154 ("Patent Document 2") describes the fact that the problem with the difficulty of lift-off in which a magnetic domain control layer is removed from above a magnetoresistive device can be prevented by the following. A mask is used to pattern the magnetoresistive element and the magnetic domain control layer is laminated on the mask remaining left. Thereafter, the magnetic domain control layer formed on the mask and a mask surface layer are removed by a planarizing process using chemical mechanical polishing (CMP) to expose the mask. The mask thus exposed is removed. Further, Patent Document 2 describes the fact that the magnetic head can be fabricated in which an upper electrode formed after the removal of a mask is joined to a magnetoresistive effect film through a projecting portion extending therefrom toward the magnetoresistive device.

Japanese Patent Publication No. 2004-186673 ("Patent Document 3") describes a method of removing a resist pattern by using CMP during lift-off process. According to this method, a first CMP stopper is disposed on the magnetoresistive effect film and a second CMP stopper is disposed on a lead layer including a magnetic bias layer and a conductive layer disposed on both sides of the magnetoresistive effect film. The resist pattern and an unnecessary film on the resist pattern are removed by CMP. In this way, a read element having a narrow track-width can be fabricated.

In the CPP-type magnetoresistive effect head (CPP-GMR head, TMR head), a magnetic domain control layer is disposed on both sides of a sensor junction via an insulating film, so that a distance between a free layer and a magnetic domain control layer is increased. Therefore, a magnetic domain control layer is needed that is thicker than that of the CIP structure which allows detection current to flow parallel to the surface of the magnetoresistive effect film. To meet the necessity, it is necessary to allow a magnetic domain control layer to protrude upward from the upper surface of the magnetoresistive effect film.

The magnetic head described in Patent Document 2 is provided with an upper insulation film between a magnetic domain control layer and an upper magnetic shield so that the film thickness of the magnetic domain control layer cannot be increased.

As described in Patent Document 3, the lift-off using CMP can remove the unnecessary resist of the device track portion and a magnetic domain control layer by the planarizing effect of CMP. However, a problem simultaneously arises in that the magnetic domain control layer not protected by the CMP stopper film is scraped beyond necessity. For example, as shown in FIG. 12, a first CMP stopper film 15 is formed on top of the magnetoresistive effect film 11 and patterning is performed using a resist pattern 18. Then, a refill insulation film 12 and a magnetic domain control layer 13 are laminated on both sides of the magnetoresistive effect film 11 and a resist pattern 18 and on top of the resist pattern 18. A second CMP stopper film 16 is formed on top of the magnetic domain control layer 13 thus laminated. In this state, a step is generated between the first CMP stopper film 15 and the second CMP stopper film 16. However, the CMP process has an effect of planarizing the step. In this state, the lift-off process is performed by CMP. Consequently, a portion of the refill insulation film 12 and magnetic domain control layer 13 which have a large CMP polishing rate and which are not protected by the first CMP stopper 15 and the second CMP stopper 16 as shown in FIG. 13 is scraped off by CMP as shown in FIG. 14. This is because of the following. DLC formed as the stopper film has high-hardness but is a brittle material. If DLC is formed into a thin film, a polishing rate of the thing film is low for CMP in a planar direction but is high at an end portion of the thin film. The magnetic domain control layer 13 cannot be protected and is scraped. As a result, the film thickness of the magnetic domain control layer 13 is reduced in the vicinity of the device, leading to a reduced bias magnetic field. The CPP structure magnetic head needs insulation by refill and thus the distance between the free layer and the magnetic domain control layer is increased. The reduced bias magnetic filed due to the reduced thickness of the magnetic domain layer has a larger influence than the CIP structure head. Thus, during manufacture of the CPP type magnetoresistive effect head, if the lift-off process using CMP is adopted, the magnetic domain control layer is scraped off. This poses a problem in that it is hard to manufacture a read head with high-stability.

BRIEF SUMMARY OF THE INVENTION

Embodiments of the present invention help to prevent a reduction in the bias magnetic field of the CPP-type magnetoresistive effect head, thus suppressing a reduction in read output. According to the particular embodiment disclosed in FIG. 1, a CPP-type magnetoresistive effect film 11 is formed on top of a lower magnetic shield 10. A refill insulation film 12 and a magnetic domain control layer 13 are formed on both sides of an intermediate layer 32 and a free layer 31 of the CPP-type magnetoresistive effect film 11. A side wall protection film 17 is formed on a side wall of the refill insulation film 12 and on top of the free layer 13 so as to define the height of the magnetic domain control layer 13. To increase the film thickness of the magnetic domain control layer 13, the magnetic domain control layer 13 and the refill insulation film 12 are higher than the top surface of the free layer 31. A magnetic shield underlayer film 19 is formed on the top surfaces of the free layer 31, the magnetic domain control layer 13 and the refill insulation film 12 and an upper magnetic shield layer 14 is formed on the magnetic shield underlayer film 19.

BRIEF DESCRIPTION OF THE DRAWINGS

FIG. 2 illustrates CMP polishing rates and Vickers hardnesses of various metal materials.

FIGS. 3A-3I illustrate a manufacturing process of the CPP-type magnetoresistive effect head according to the first embodiment.

DETAILED DESCRIPTION OF THE INVENTION

Figure 1:
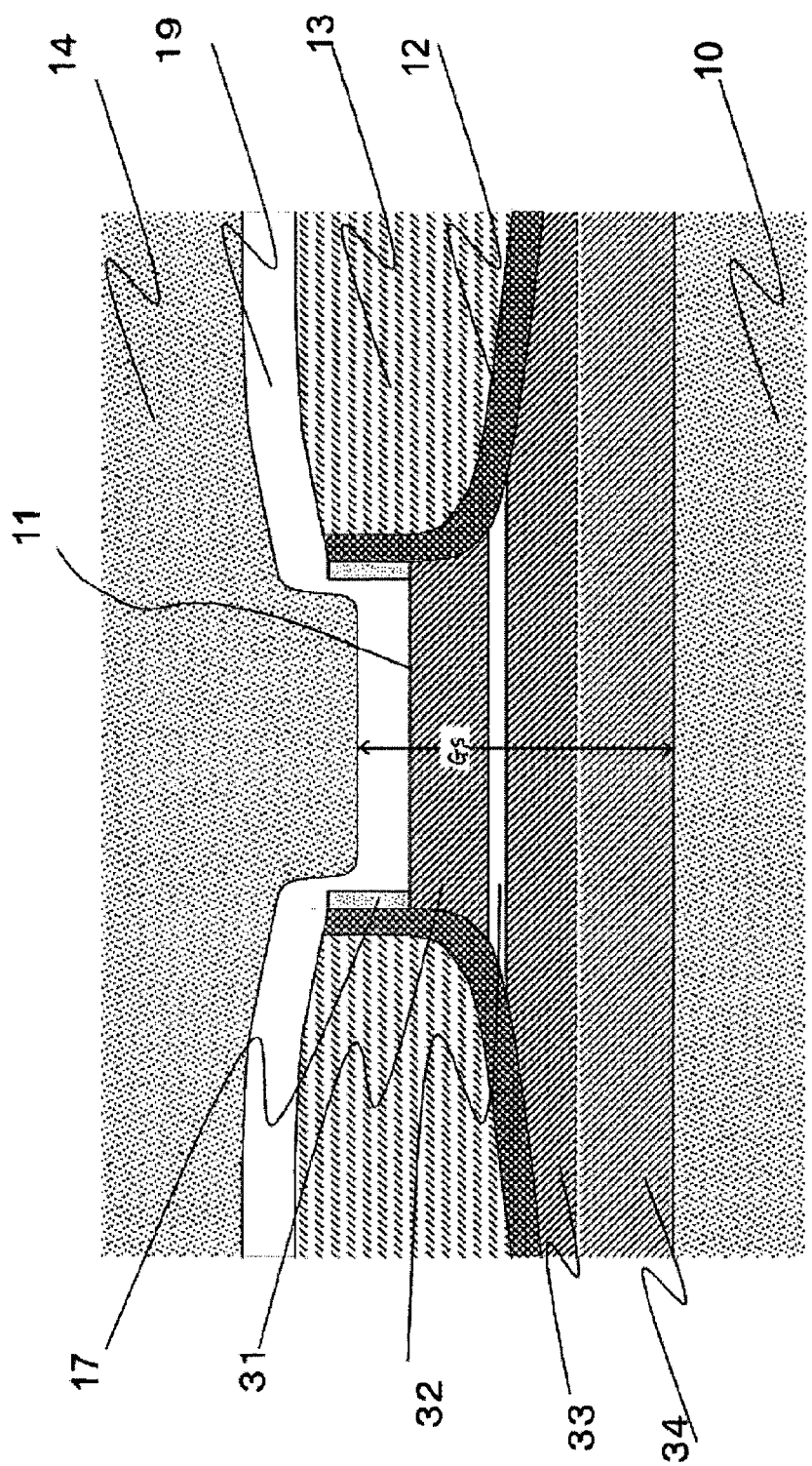
FIG. 1 illustrates a CPP-type magnetoresistive effect head according to a first embodiment as viewed from an air-bearing surface.

Embodiments of the present invention relate to a read magnetic head including a magnetoresistive sensor which reads magnetically recorded information. In particular, embodiments of the invention relate to a magnetoresistive effect head with a CPP-structure which allows detection current to flow in a direction perpendicular to a film surface and to a method of manufacturing the same.

An object of embodiments of the present invention is to provide a CPP type magnetoresistive effect head that suppresses fluctuation in read output due to a bias magnetic field.

Another object of embodiments of the present invention is to provide a CPP type magnetoresistive effect head manufacturing method that prevents a reduction in film thickness of a magnetic domain control layer near a magnetoresistive effect film even in the case of adopting a lift-off process using CMP.

To achieve the above object, a CPP-type magnetoresistive effect head according to embodiments of the present invention includes: a lower magnetic shield layer; a magnetoresistive effect film including an antiferromagnetic layer, a pinned layer made of alloy containing a ferromagnetic material, an intermediate layer made of a nonmagnetic material and a free layer made of alloy containing a ferromagnetic material which are laminated on top of the lower magnetic shield layer; a refill insulation film and a magnetic domain control layer formed on both sides of the magnetoresistive effect film to protrude from an upper surface of the magnetoresistive effect film; a side wall protection film formed on a side wall of the refill insulation film and on top of the magnetoresistive effect film so as to define the height of the magnetic domain control layer; and an upper magnetic shield layer formed on top of the magnetoresistive effect film and the magnetic domain control layer.

To achieve another object described above, a method of manufacturing a CPP-type magnetoresistive effect head according to embodiments of the present invention includes the steps of: forming a lower electrode and lower magnetic shield layer on top of a substrate; forming, on top of the lower electrode and lower magnetic shield layer, a magnetoresistive effect film by laminating a antiferromagnetic layer, a pinned layer made of alloy containing a ferromagnetic material, an intermediate layer made of a nonmagnetic material and a free layer containing alloy containing a ferromagnetic material; forming a metal film on top of the magnetoresistive effect film; forming a first CMP stopper film on the metal film; forming a resist pattern on the first CMP stopper film; patterning the first CMP stopper film using the resist pattern as a mask; sputtering the metal film by an ion beam sputtering method to form a side wall protection film on side walls of the first CMP stopper film patterned and the resist pattern; patterning the magnetoresistive effect film by milling; forming a refill insulation film and a magnetic domain control layer on both sides of the magnetoresistive effect film patterned; forming a second CMP stopper film on the magnetic domain control layer; removing the resist pattern and the refill insulation film and the magnetic domain control layer deposited on the resist pattern by chemical mechanical polishing (CMP); removing the first CMP stopper film and the second CMP stopper film; and forming an upper electrode and upper magnetic shield layer.

Embodiments of the present invention can prevent a reduction in the bias magnetic field of the CPP-type magnetoresistive effect head, thus suppressing a reduction in read output.

In addition, in the manufacture of the CPP-type magnetoresistive effect head, a reduction in the film thickness of the magnetic domain control layer close to the magnetoresistive effect film can be prevented even in the case of using a lift-off process making use of CMP.

Embodiments of the present invention will hereinafter be described with reference to the drawings.

FIG. 1 illustrates a CPP-type magnetoresistive effect head according to a first embodiment of the present invention as viewed from the air bearing surface side. This CPP-type magnetoresistive effect head is a partial mill CPP-structure magnetic head in which milling is not performed to a lower magnetic shield 10 and is stopped at a sensor film intermediate layer 32. A partial mill is performed to reduce an amount of milling. This provides advantages of less encrustation and of less ion exposure damage to a magnetoresistive effect film. A lower magnetic shield 10 is formed on a substrate not shown. A CPP-type magnetoresistive effect film 11 is formed on the lower magnetoresistive shield layer 10. The CPP-type magnetoresistive effect film 11 includes an antiferromagnetic layer 34, a pinned layer 33 made of alloy containing a ferromagnetic material, an intermediate layer 32 made of a nonmagnetic material and a free layer 31 made of alloy containing a ferromagnetic material. A refill insulation film 12 and a magnetic domain control layer 13 are formed on both sides of the intermediate layer 32 and free layer 31 of the CPP-type magnetoresistive control layer 11. A side wall protection film 17 is formed on a side wall of the refill insulation film 12 and on the free layer 31 so as to define the height of the magnetic domain control layer 13. To increase the film thickness of the magnetic domain control layer 13, the magnetic domain control layer 13 and refill insulating layer 12 are higher than the upper surface of the free layer 31. A magnetic shield underlayer film 19 is formed on top of the free layer 31, the magnetic domain control layer 13 and the refill insulation film 12. An upper magnetic shield layer 14 is formed on the magnetic shield underlayer film 19. The antiferromagnetic layer 34 fixes the magnetizing direction of the pinned layer 33. The magnetic domain control layer 13 controls the magnetizing direction of the free layer 31 via the refill insulation film 12. The refill insulation film 12 is adapted to insulate the conduction between the magnetic domain control layer 13, and the lower magnetic shield 10 and upper magnetic shield 14 both serving as electrodes.

In the lift-off process by CMP described later, the side wall protection film 17 is adapted to protect the magnetic domain control layer 13 from being scraped beyond necessity when an unnecessary resist pattern, the refill insulation film 12 and magnetic domain control layer 13 on the lateral surface and upper surface of the resist pattern are removed. In addition, the polishing rate of the CMP is needed to be low. The CMP polishing rate generally depends on the hardness of a material. The polishing rates and Vickers hardnesses of major materials encountered when a down force (weighted) is 6 psi are as shown FIG. 2. The thickness of the side wall protection film 17 may be as thin as possible in view of the dimensional accuracy of the track width, preferably at least 10 nm or less. Taking into account the actual polishing time being about 60 seconds, it is appropriate to use a material having a polishing rate of less than 10 nm/min. Thus, the side wall protection film 17 may use metal having a Vickers hardness of at least 80 HV or an alloy material containing the metal. In view of the relationship between the CMP polishing rate and the Vickers hardness, the candidate is metal selected from the group consisting of Co, Cr, Mo, Hf, Ir, Nb, Re, Rh, Ru, and W shown in Table 1, and alloy containing at least one of the metals.

With the CPP-type magnetoresistive effect head according to the first embodiment, since the side wall protection film 17 is formed on the side wall of the refill insulation film 12, the magnetic domain control layer 13 is protected from being scraped beyond necessity in the lift-off process by CMP. The film thickness of the magnetic domain control layer 13 close to the magnetoresistive effect film can be increased. In addition, a bias magnetic field can efficiently be applied to the free layer. Thus, a reduction in read output can be suppressed.

Figure 3A:
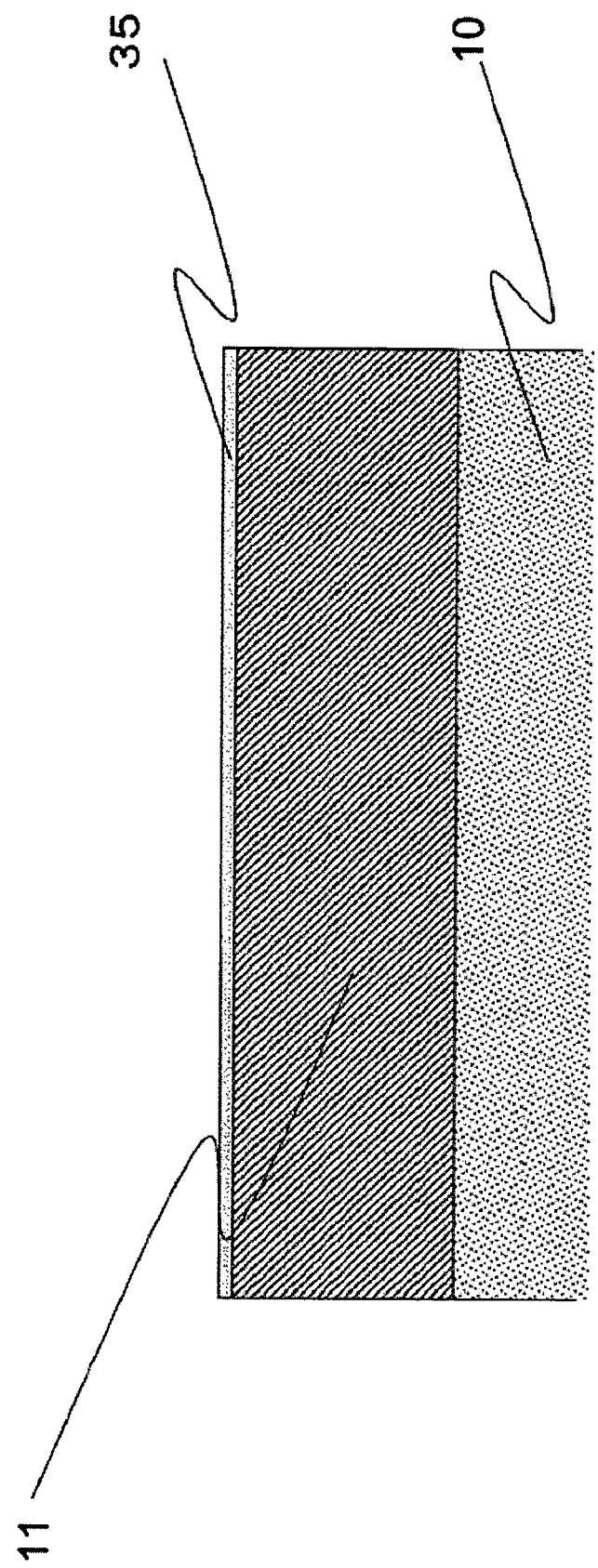

A description is next made of a method of manufacturing the CPP-type magnetoresistive effect head of the first embodiment described above with reference to FIGS. 3A through 3I. Referring to FIG. 3A, an undercoat made of alumina is formed on an AlTiC substrate not shown. Permalloy 10 is formed on the undercoat by a sputtering method or by a combination of a plating method with photolithography. The permalloy 10 thus formed will become a lower electrode of the device and also serves as a lower magnetic shield layer of the device because of using a magnetic film. Thereafter, an insulation film made of e.g. alumina is deposited and the surface thereof is planarized by CMP (chemical mechanical polishing method). The surface of the substrate is made of a permalloy pattern and the insulation film on the periphery of the permalloy pattern so as to be planar by such processing. A CPP-type magnetoresistive effect film II is formed by the sputtering method on the lower magnetic shield layer 10 thus formed. As described with FIG. 1, the CPP-type magnetoresistive effect film 11 includes the free layer 31 and pinned layer 33 each made of alloy containing a ferromagnetic material, the antiferromagnetic layer 34 disposed below the pinned layer 33 and made of an antiferromagnetic material so as to fix the magnetizing direction of the pinned layer 33, and the intermediate layer 32 made of a nonmagnetic material so as to be put between the two layers, the free layer 31 and the pinned layer 33. Subsequently, a metal film 35 is formed which will become a material formed as the side wall protection film 17. The side wall protection film 17 is adapted to protect the refill insulation film 12 and the magnetic domain control film 13 formed by the later process from being scraped by CMP.

Figure 3B:
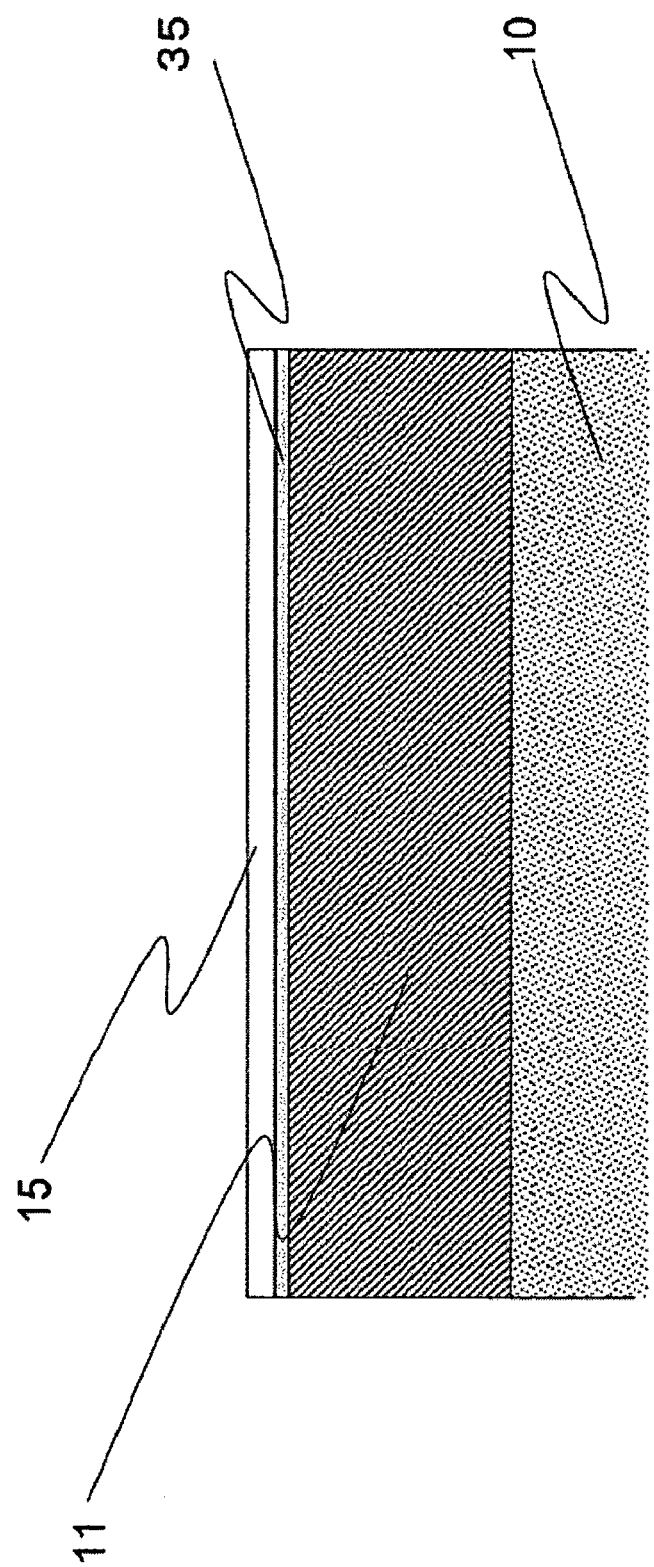

Referring to FIG. 3B, the first CMP stopper film 15 is next formed on the metal film 35. This first CMP stopper film 15 is formed in order to protect the CPP-type magnetoresistive effect film 11 from being damaged by CMP performed in the following process. The first CMP stopper film 15 preferably uses a material removable by etching after lift-off, for example. DLC (diamond like carbon) which can easily be etched by oxygen plasma and has a small CPM polishing rate.

Figure 3D:
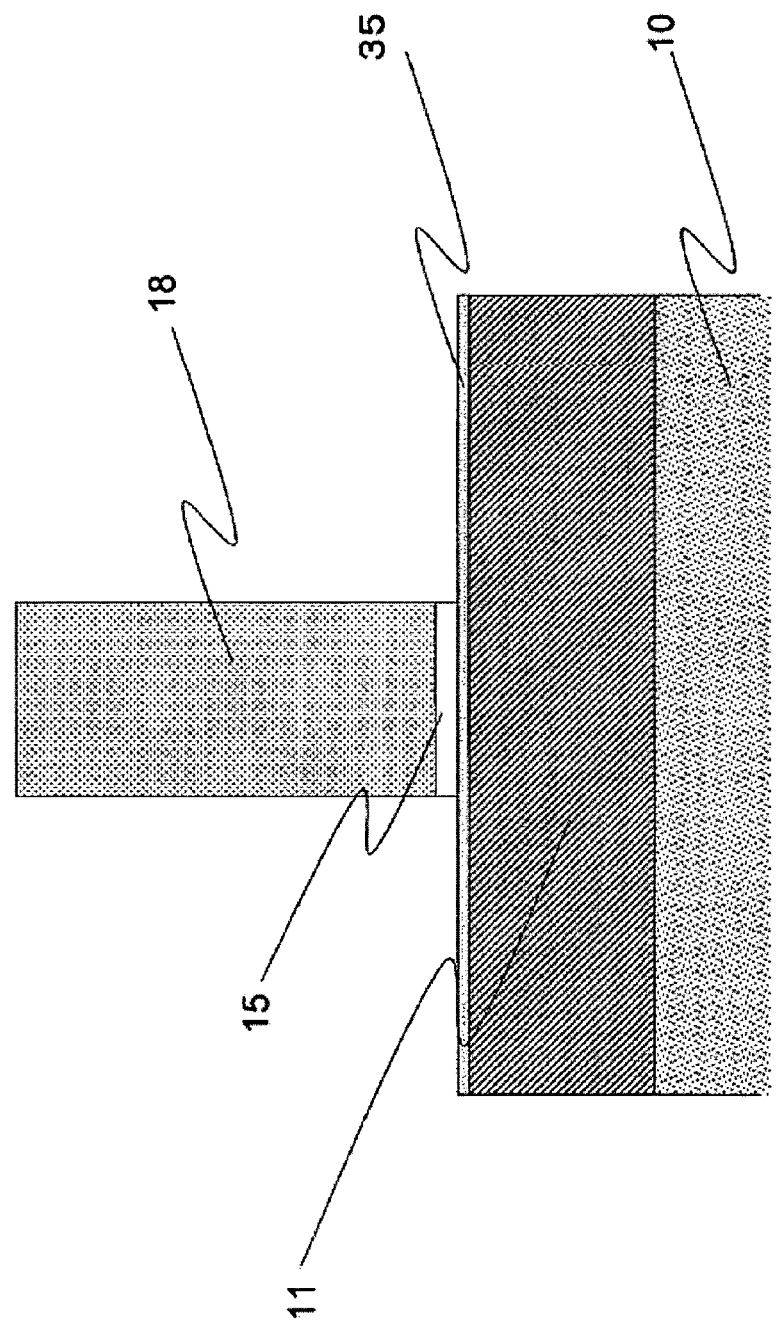

Referring to FIG. 3C, the resist pattern 18 is next formed by photolithography to pattern the CPP-type magnetoresistive effect film 11. Referring to FIG. 3D, the first CMP stopper film 15 is subsequently patterned by RIE (reactive ion etching) or by ion milling. The metal film 35 is next sputtered by an ion beam sputtering method to form the side wall protection film 17 on the side wall portions of the first CMP stopper film 15 patterned and the resist pattern 18 on the first CMP stopper film 15 as shown in FIG. 3E. Thereafter, the magnetoresistive effect film 11 is patterned by milling. The milling is stopped at a position of the intermediate layer 32 of the magnetoresistive effect film 11. In this case, it is important not to remove the side wall protection film 17 by optimizing the conditions of the milling.

Referring to FIG. 3F, after the refill film 12 is formed, the magnetic domain control layer 13 is formed by a sputtering method and further the second CMP stopper film 16 is formed on the magnetic domain control layer 13. The second CMP stopper film 16 is disposed to protect the magnetic control layer 13 from the lift-off process using CMP performed in the subsequent process. The second CMP stopper film 16 may use a material removable by etching after lift-off, for example, DLC which can easily be etched by oxygen plasma and has a small CPM polishing rate.

Figure 3G:
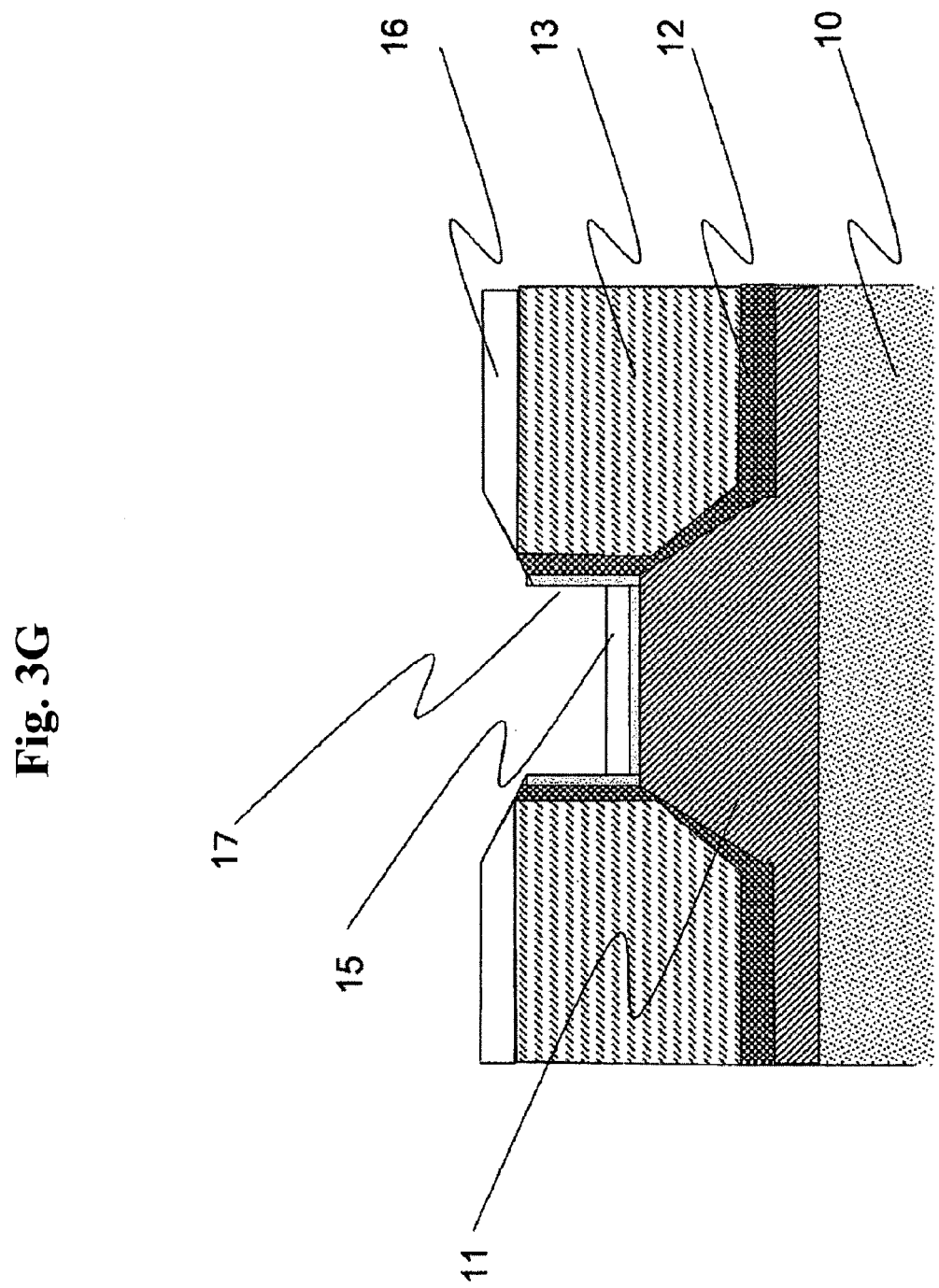

Referring to FIG. 3G, the resist pattern 18 and the unnecessary refill insulation film and magnetic domain control layer deposited on the resist pattern 18 are removed by CMP. In this case, the side wall protection film 17 suppresses the scrape of the refill insulation film 12 and magnetic domain control layer 13. Thus, the CPP-type magnetoresistive effect head formed by this method has such a shape as that the magnetic domain control layer 13 protrudes toward the upper magnetic shield layer 14 as shown in FIG. 1. In other words, the upper magnetic shield layer 14 is shaped downwardly convexedly.

Figure 3H:
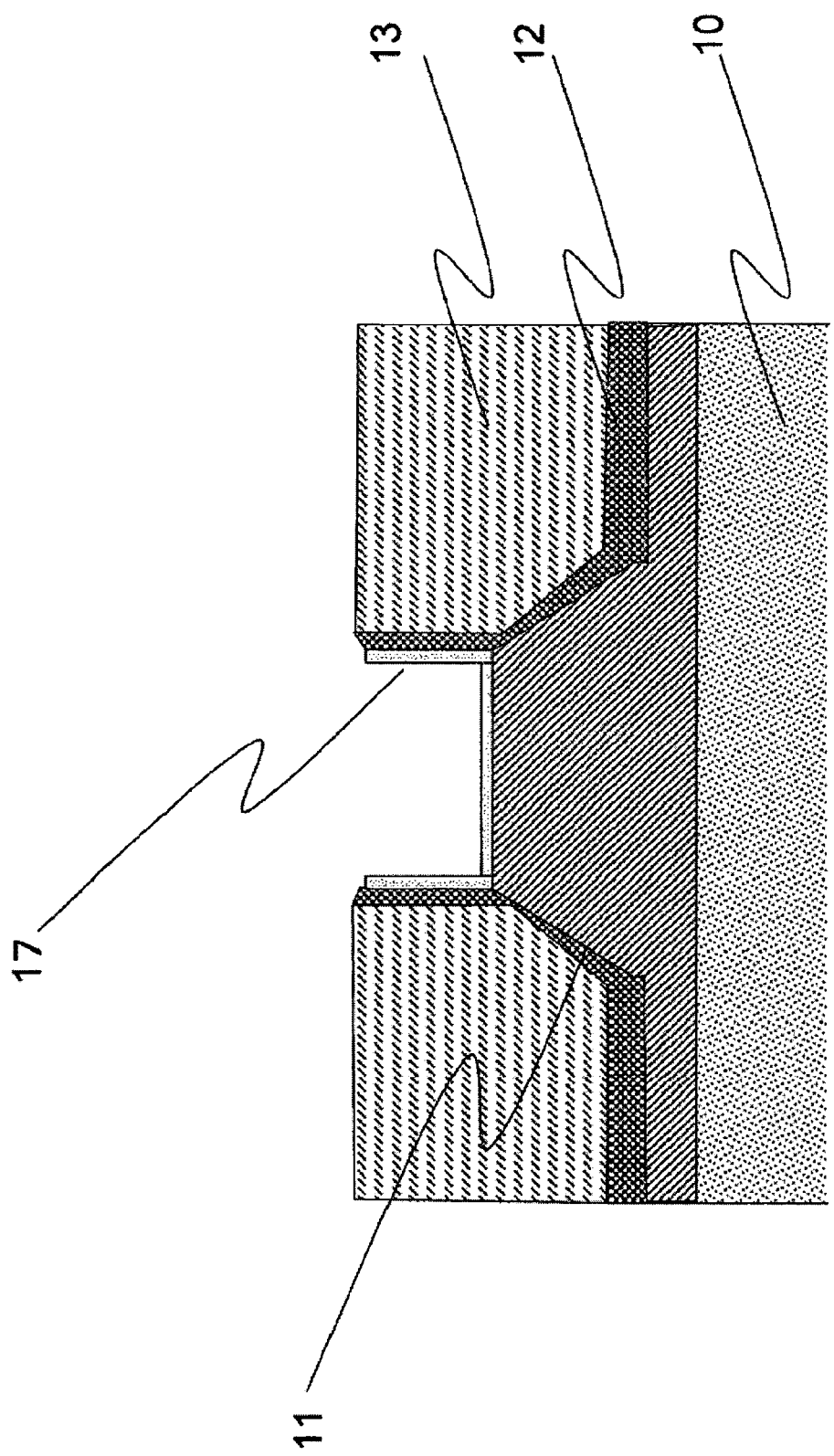
Figure 3I:
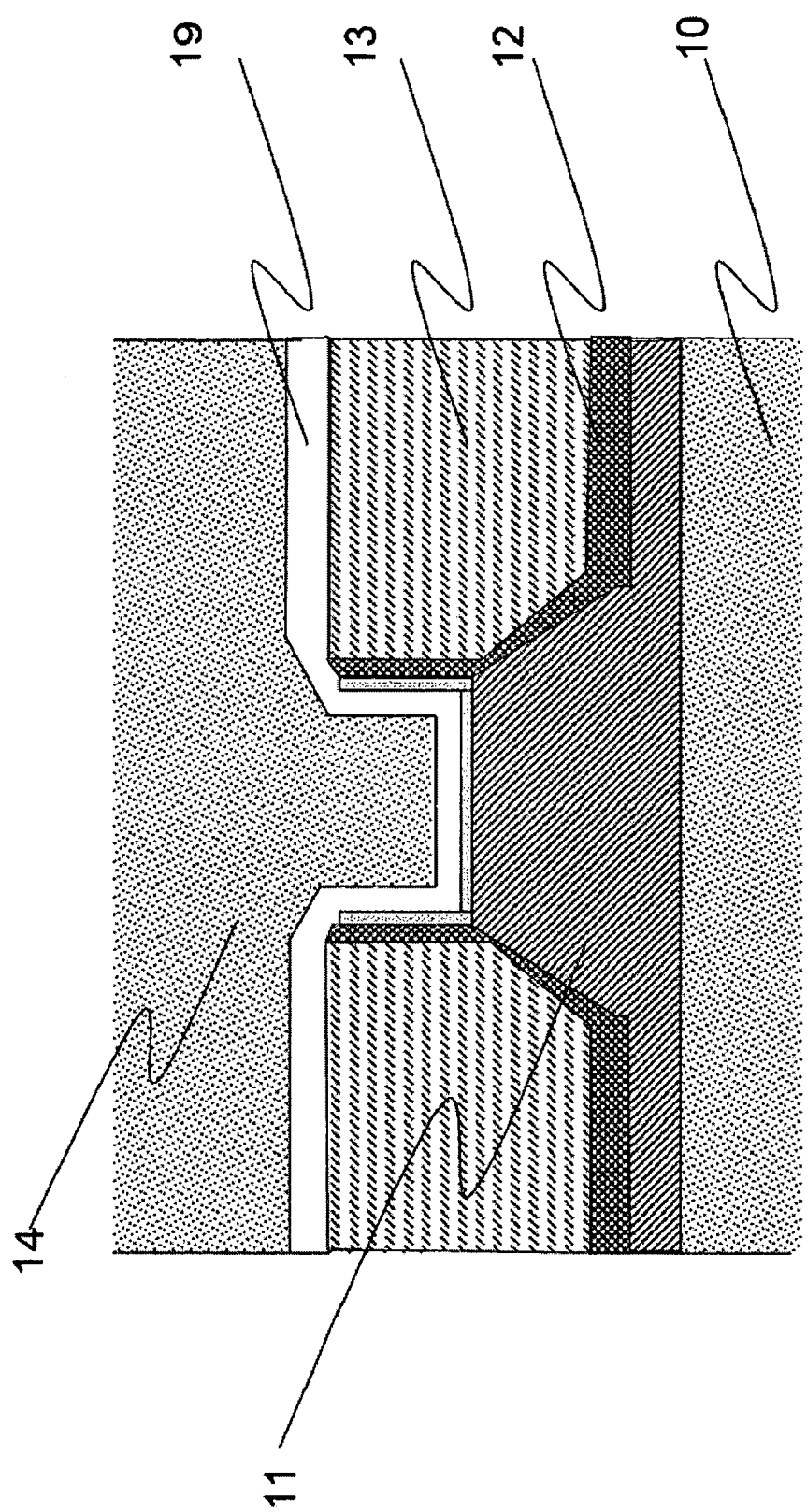

Referring to FIG. 3H, the unnecessary first and second CMP stopper films 15, 16 are removed by RIE using oxygen. Thereafter, the magnetic shield underlayer film 19 made of a nonmagnetic metal material and the upper magnetic shield layer 14 are formed sequentially by a sputtering method or by a combination of a plating method with photolithography as shown in FIG. 3I.

The CPP-type magnetoresistive effect head manufactured by the above manufacturing method was compared with the conventional CPP-type magnetoresistive effect head manufactured by lift-off using CMP in terms of a bias magnetic field determined from the transfer curve of resistance value changes with respective to the external magnetic field. As a result, the bias magnetic field of the CPP-type magnetoresistive effect head manufactured by the above manufacturing method is about 2.25 times greater than that of the conventional magnetic head not using the side wall protection film. In addition, the volume of the magnetic domain control layer of the CPP-type magnetoresistive effect head manufactured by the above manufacturing method, which is estimated from the cross-section TEM photograph, is about two times greater than that of the conventional magnetic head not using the side wall protection film.

Figure 4:
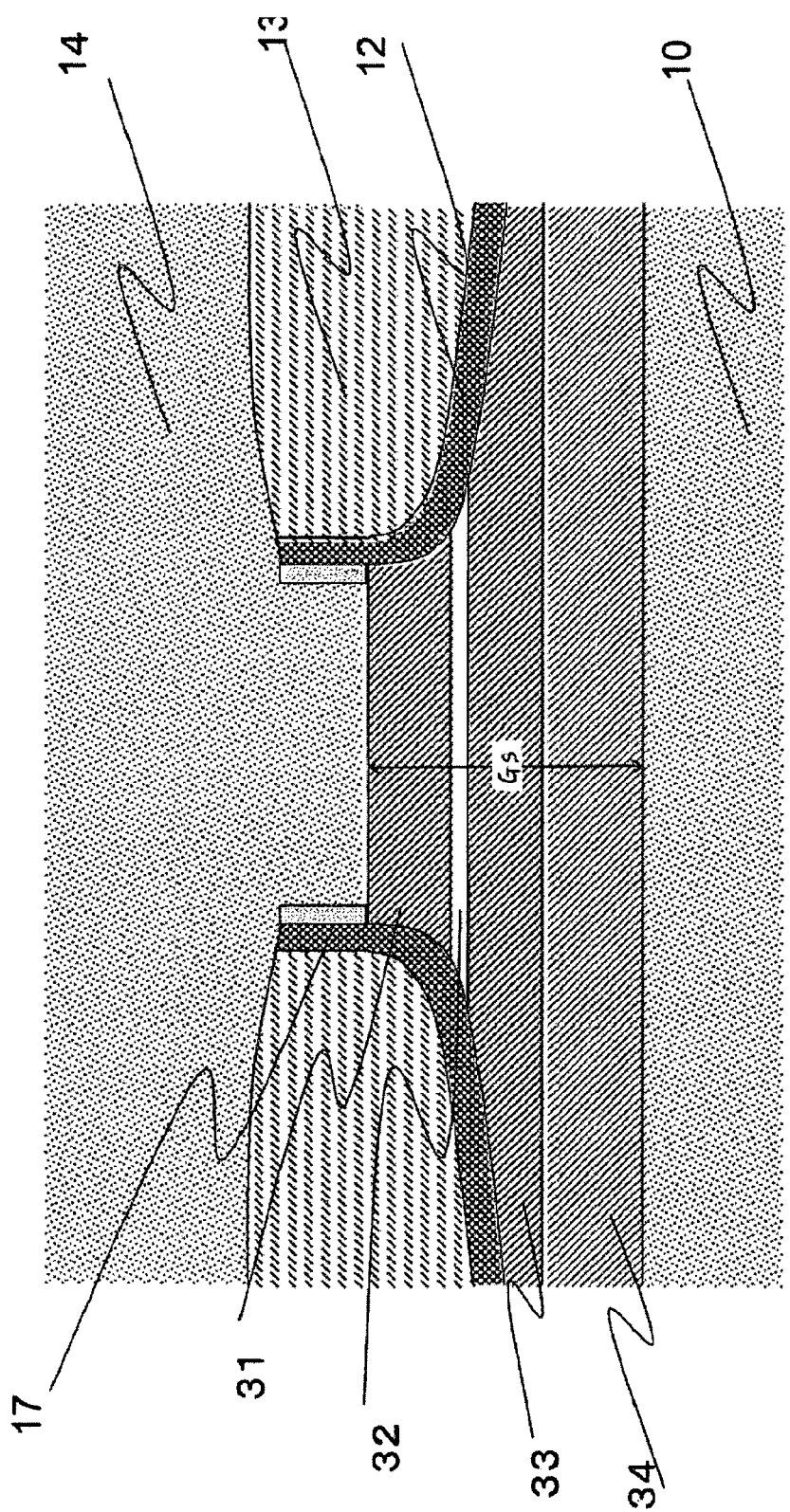
FIG. 4 illustrates a CPP-type magnetoresistive effect head according to a modification of the first embodiment as viewed from the air-bearing surface.

FIG. 4 illustrates a CPP-type magnetoresistive effect head according to a modification of the first embodiment as viewed from the air-bearing surface. This modification is different from the first embodiment in omission of the magnetic shield underlayer film 19. In other words, the modification has a structure in which the magnetic shield underlayer film 19 of FIG. 1 is formed of a magnetic material. This structure can make the distance (Gs) between the upper and lower magnetic shield layers narrower than that of the structure shown in FIG. 1. Therefore, recording density can be increased. However, the distance between the upper magnetic shield layer 14 and the magnetic domain control layer 13 is reduced; therefore, magnetic flux from the magnetic domain control layer 13 is absorbed by the upper magnetic shield layer 14 to slightly reduce the bias magnetic field.

Figure 5:
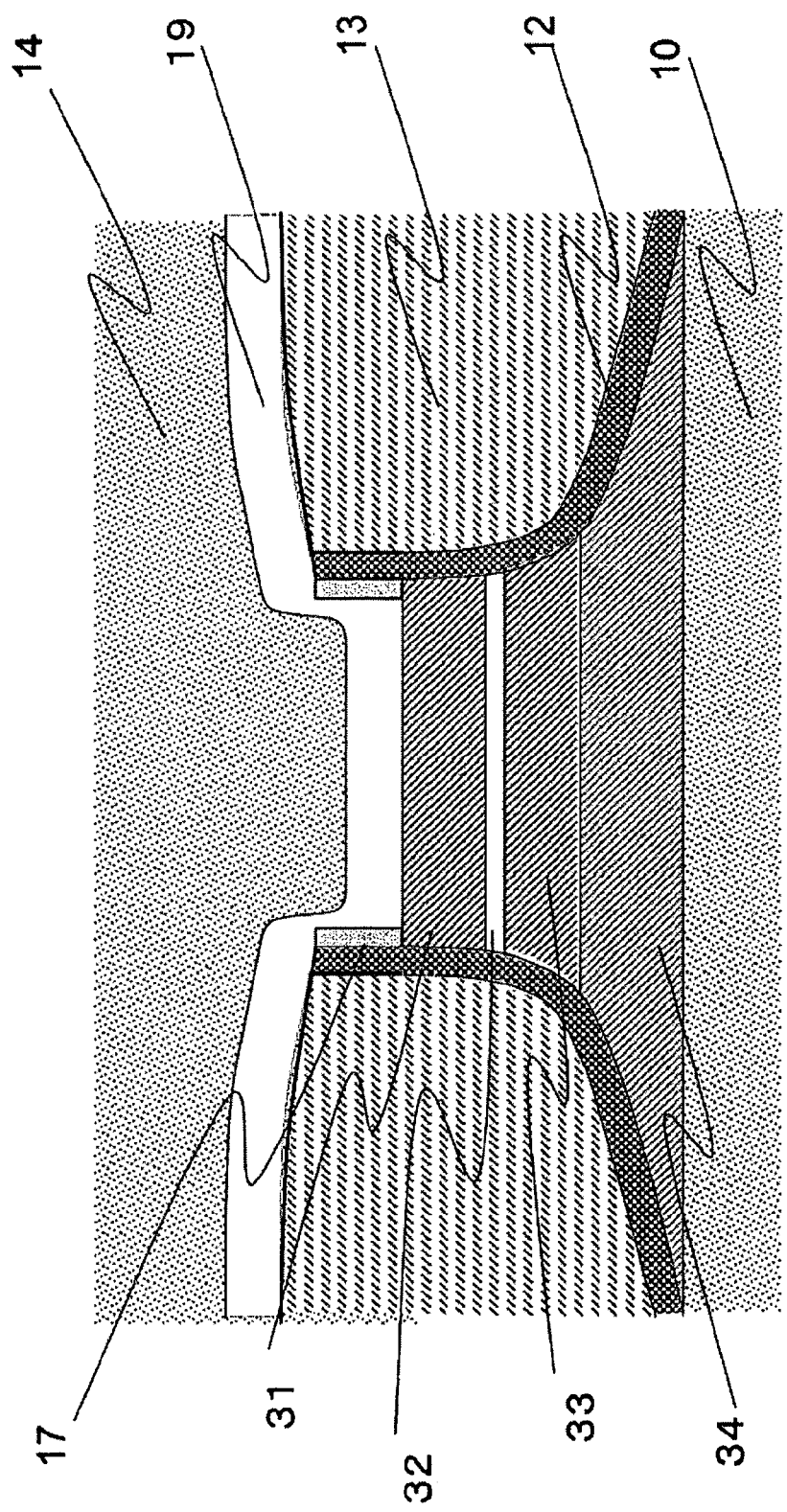
FIG. 5 illustrates a CPP-type magnetoresistive effect head according to another modification of the first embodiment as viewed from the air-bearing surface.

FIG. 5 illustrates a CPP-type magnetoresistive effect head according to another modification of the first embodiment as viewed from the air-bearing surface. This modification is different from the first embodiment in application of a full-milling CPP-type magnetoresistive effect head in which milling is performed to reach the lower magnetic shield layer 10. This structure can make the magnetic domain control layer 13 thicker than those of the structures in FIGS. 1 and 4; therefore, a read head more stable in read output can be provided.

Figure 6:
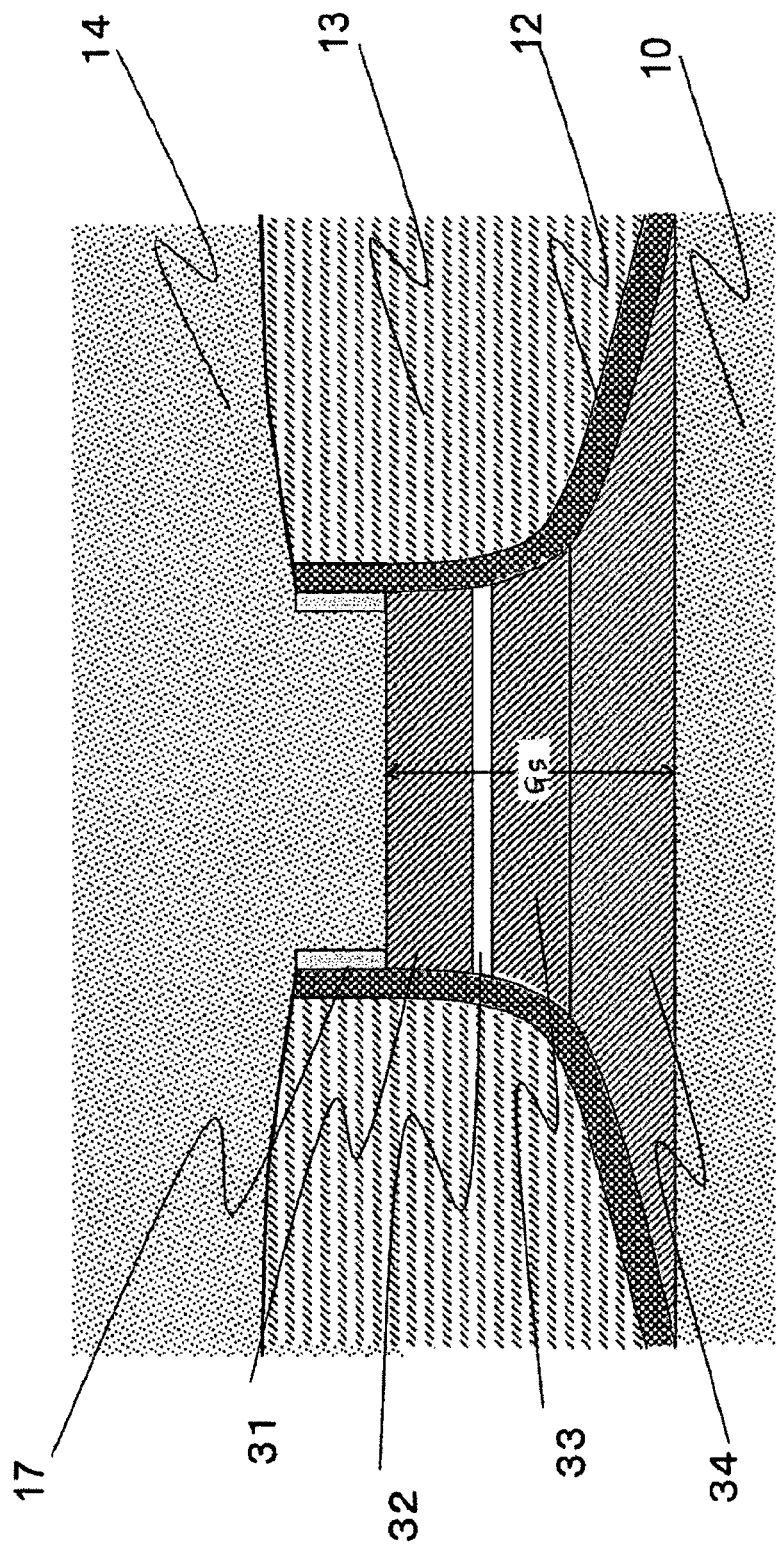
FIG. 6 illustrates a CPP-type magnetoresistive effect head according to further another modification of the first embodiment as viewed from the air-bearing surface.

FIG. 6 illustrates a CPP-type magnetoresistive effect head according to further modification of the first embodiment as viewed from the air-bearing surface. This modification is structured to omit the magnetic shield underlayer film from the structure shown in FIG. 5. This structure can increase the film thickness of the magnetic domain control layer 13 and narrow the distance (Gs) between the upper and lower magnetic shield layers.

Figure 7:
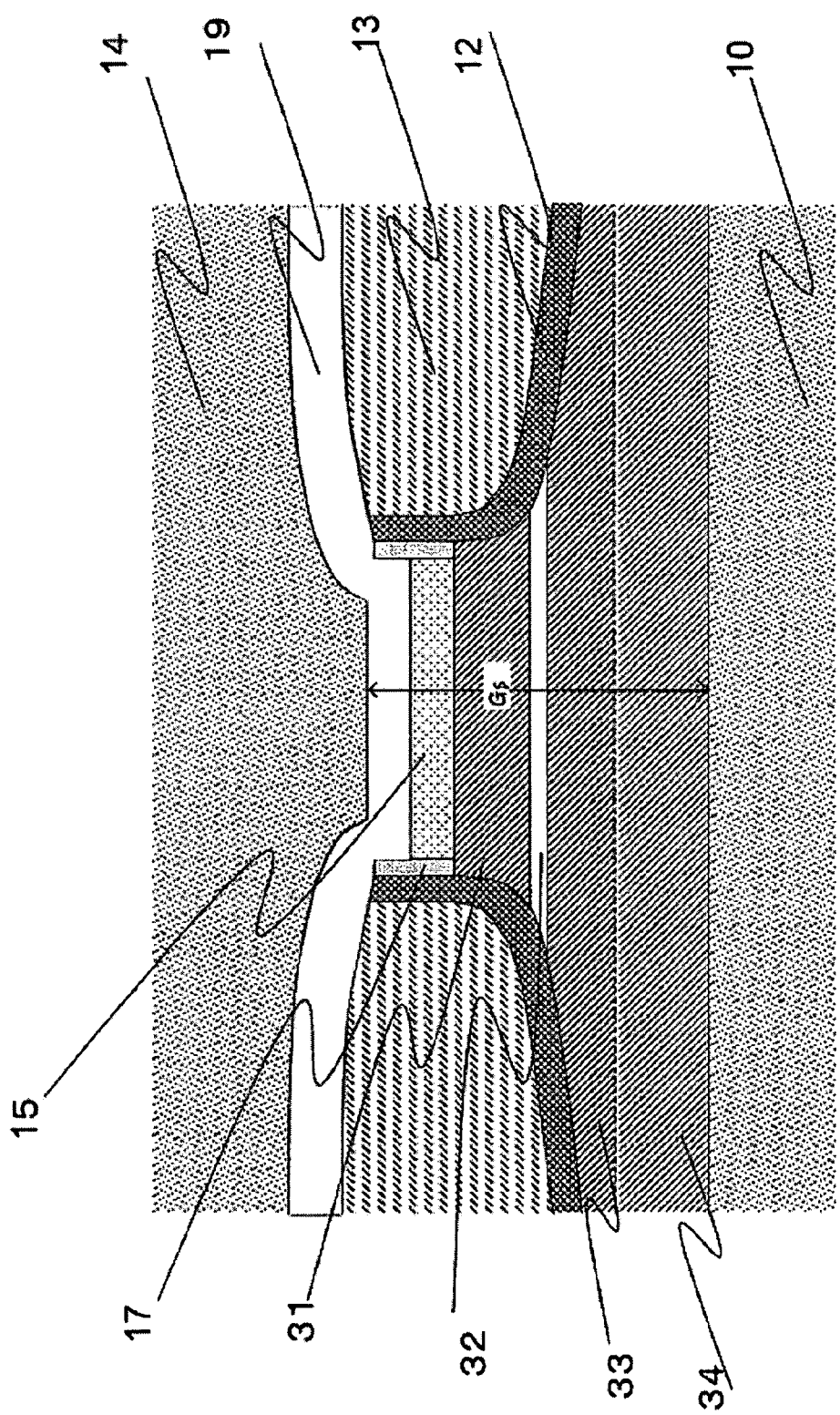
FIG. 7 illustrates a CPP-type magnetoresistive effect head according to a second embodiment as viewed from an air-bearing surface.

A description is made of the configuration of a CPP-type magnetoresistive effect head according to a second embodiment with reference to FIG. 7. The first embodiment and their modifications use the DLC films as the CMP stopper films 15, 16. However, without limiting this, a metal material can be used which has low specific resistance and high acid resistance and alkali resistance, such as Co, Cr, Mo, Hf, Ir, Nb, Re, Rh, Ru, W, or alloy containing at least one of them. In this case, the CMP stopper films also serve as gap layers to adjust the distance (Gs) between the upper and lower magnetic shield layers, which provides an advantage that the protection film removal process can be omitted as a wafer process. FIG. 7 illustrates the case of partial milling, in which if the magnetic shield underlayer film 19 is made of a nonmagnetic material, also the first CMP stopper film 25 is made of a nonmagnetic material. In this case, while the distance (Gs) between the upper and lower magnetic shield layers is increased, the distance between the magnetic domain control layer 13 and the upper magnetic shield layer 14 is increased. Thus, the bias magnetic field can efficiently be applied to the free layer 31.

Figure 8:
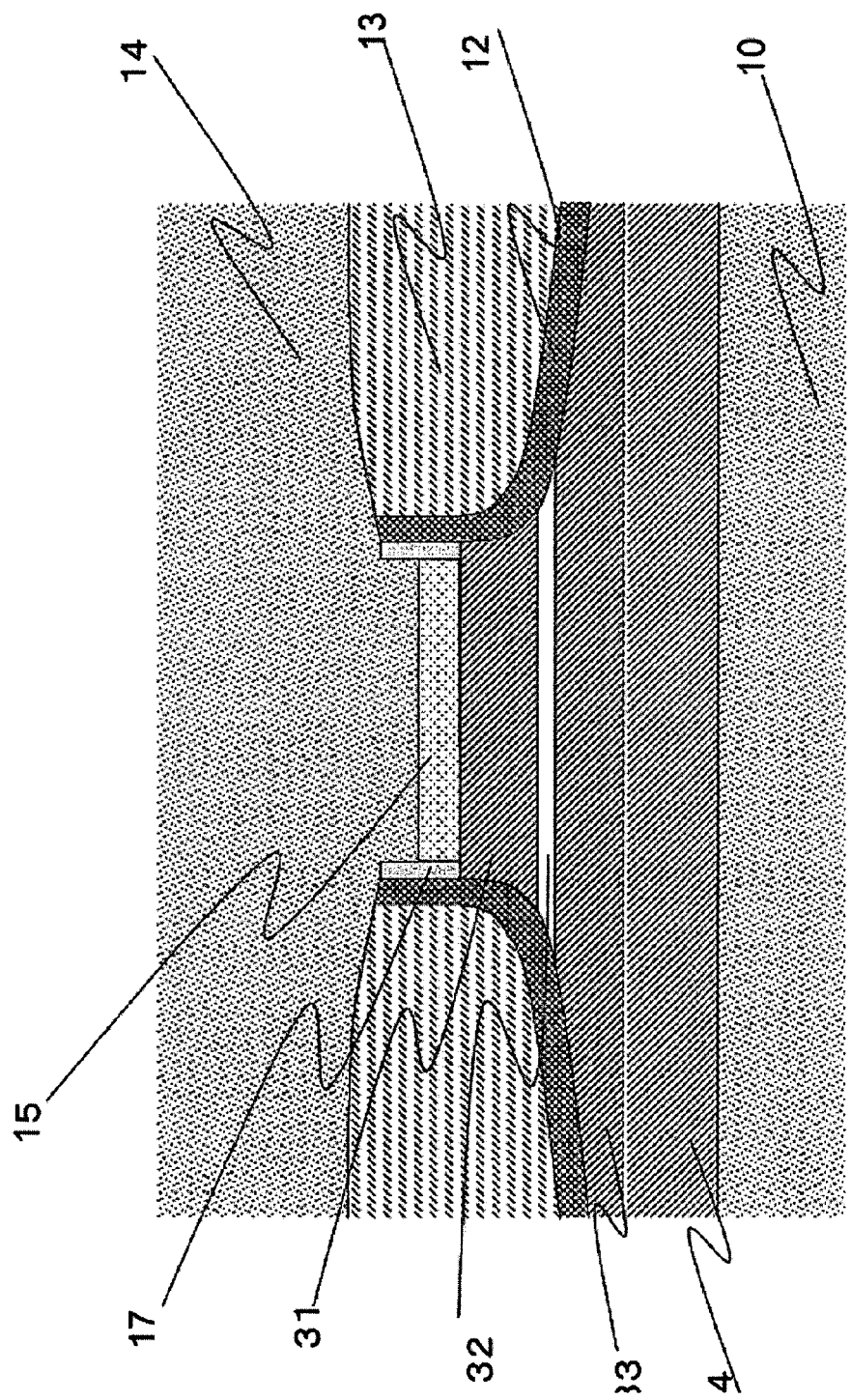
FIG. 8 illustrates a CPP-type magnetoresistive effect head according to a modification of the second embodiment as viewed from the air-bearing surface.

FIG. 8 illustrates a CPP-type magnetoresistive effect head according to a modification of the second embodiment as viewed from the air-bearing surface. The modification is different from the second embodiment in that the magnetic shield underlayer film 19 is not provided. In other words, this modification has a structure in which the magnetic shield underlayer film of FIG. 7 is made of a magnetic material. If the CMP stopper film 25 is made of a nonmagnetic film, this modification has the same advantage as that of the second embodiment. If the CMP stopper film 25 is made of a magnetic material, the distance (Gs) between the upper and lower magnetic shield layers can advantageously be narrowed but the bias magnetic field is slightly reduced.

Figure 9:
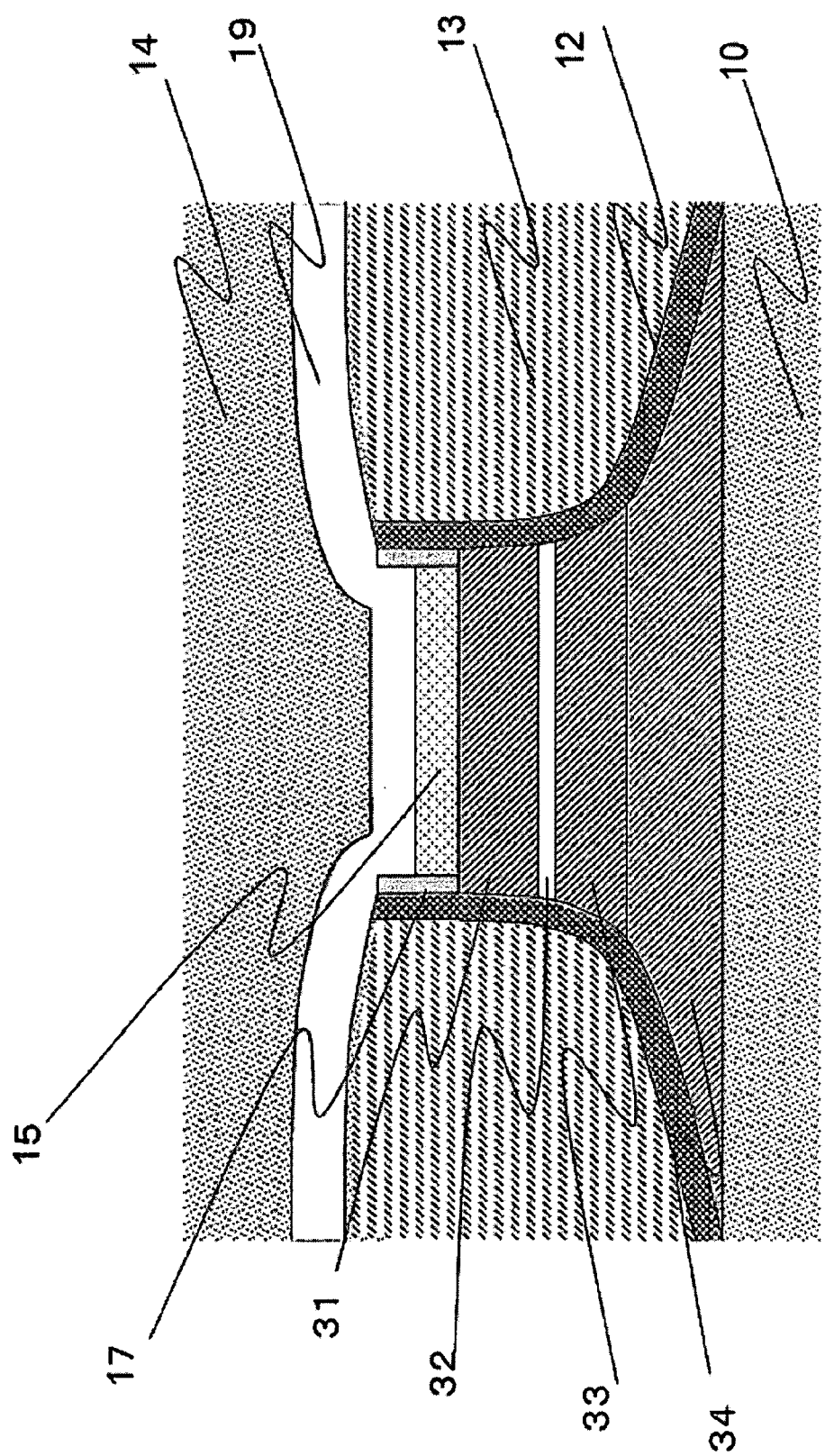
FIG. 9 illustrates a CPP-type magnetoresistive effect head according to another modification of the second embodiment as viewed from the air-bearing surface.

FIG. 9 illustrates a CPP-type magnetoresistive effect head according to another modification of the second embodiment as viewed from the air-bearing surface. This modification is different from the second embodiment in application of a full-milling CPP-type magnetoresistive effect head in which milling is performed to reach the lower magnetic shield layer 10. This structure can make the magnetic domain control layer 13 thicker than those of the structures in FIGS. 7 and 8; therefore, a read head more stable in read output can be provided.

Figure 10:
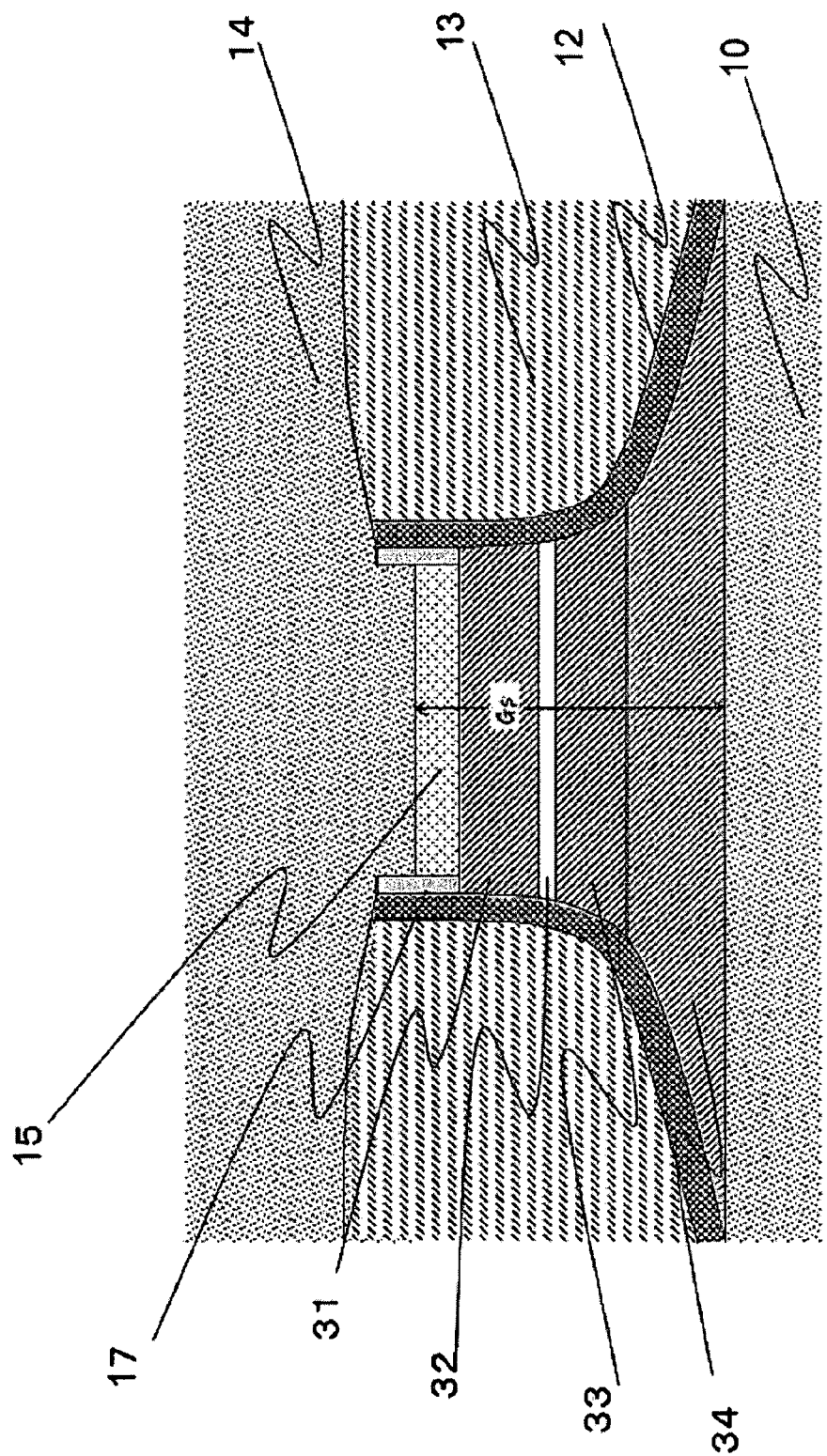
FIG. 10 illustrates a CPP-type magnetoresistive effect head according to further another modification of the second embodiment as viewed from the air-bearing surface.
Figure 11:
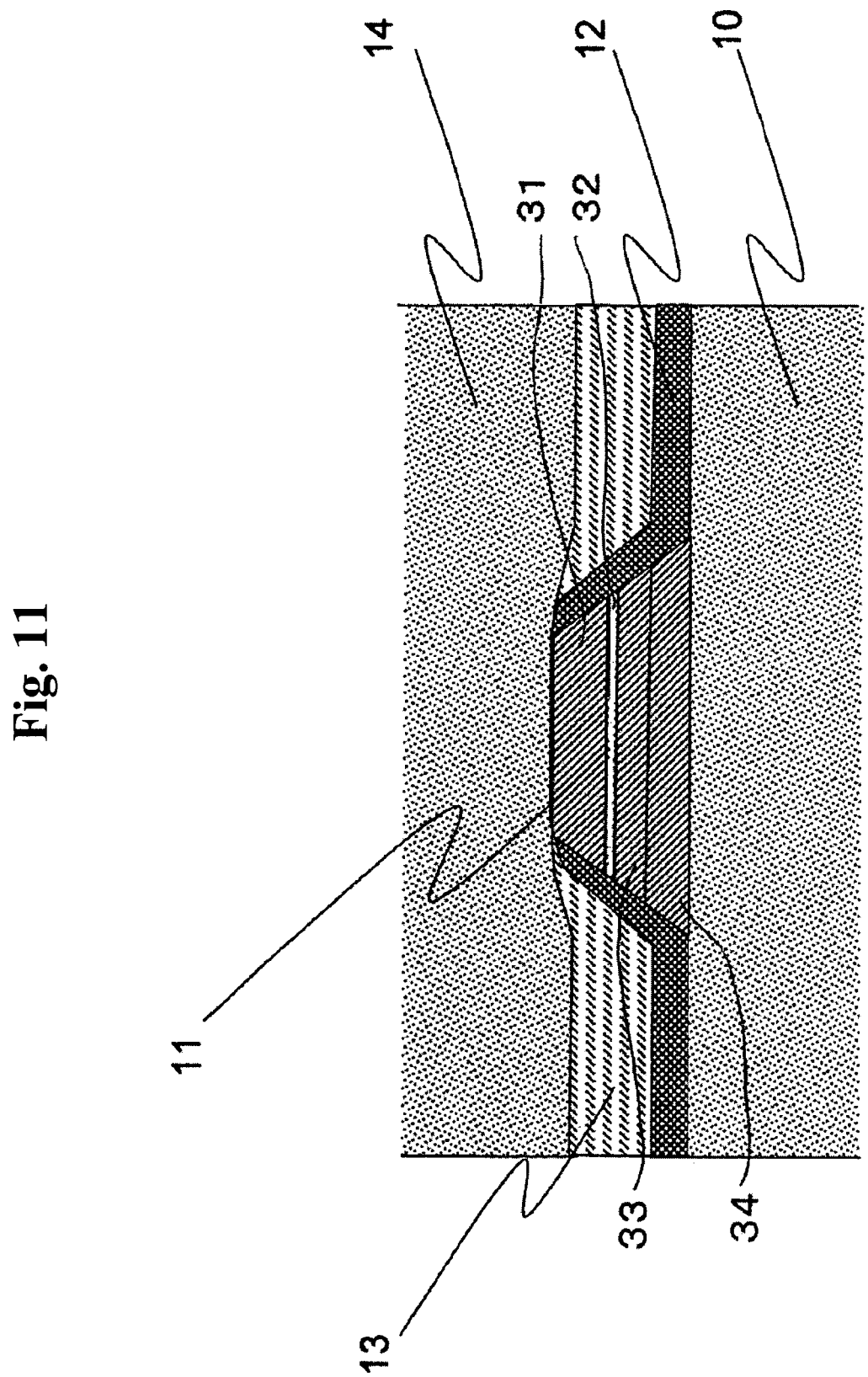
FIG. 11 illustrates the basic configuration of a CPP-type magnetoresistive effect head as viewed from an air-bearing surface.
Figure 12:
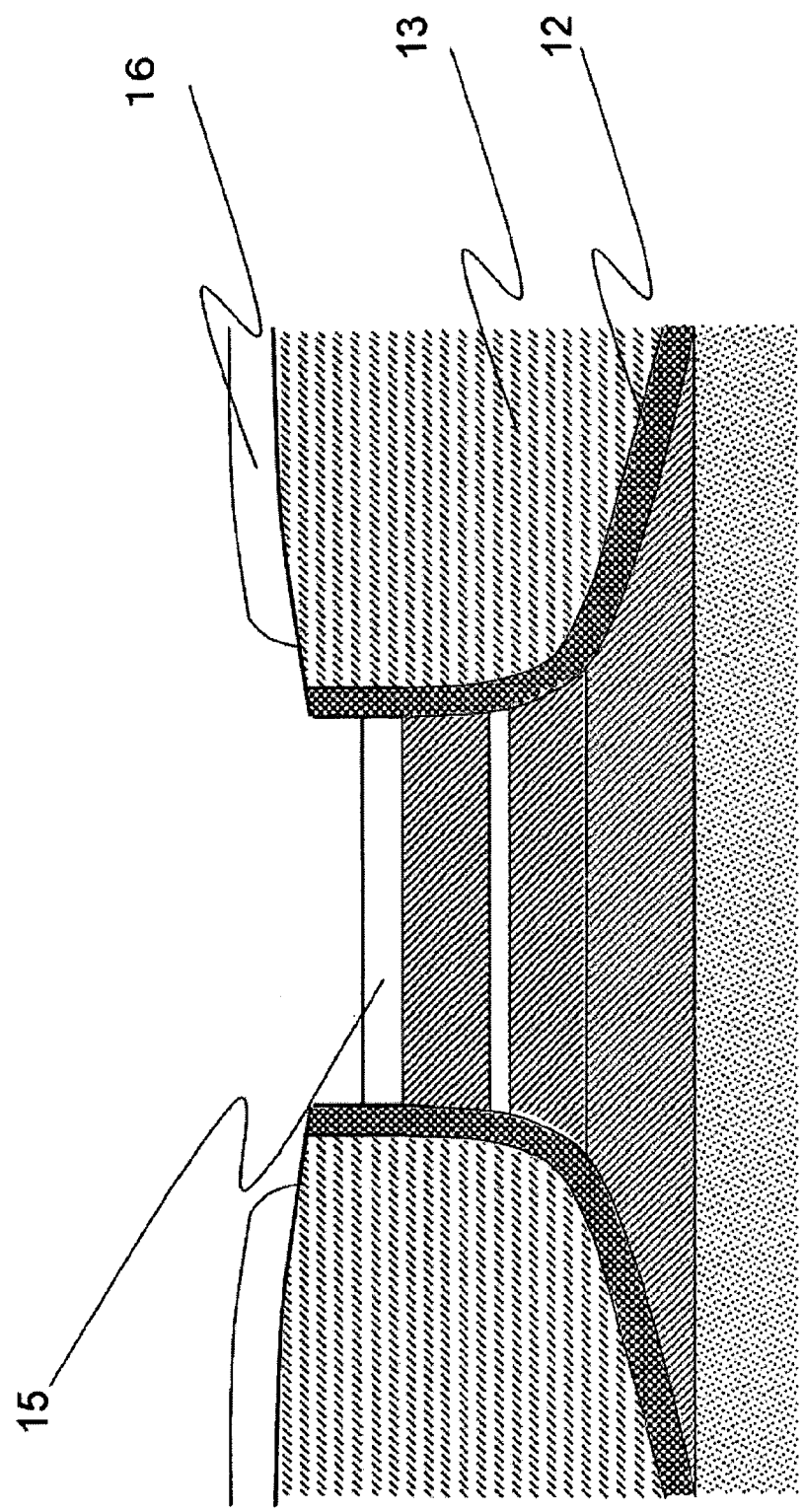
FIG. 12 illustrates a CPP-type magnetoresistive element before execution of a lift-off process using CMP according to the conventional art, as viewed from the air-bearing surface.
Figure 13:
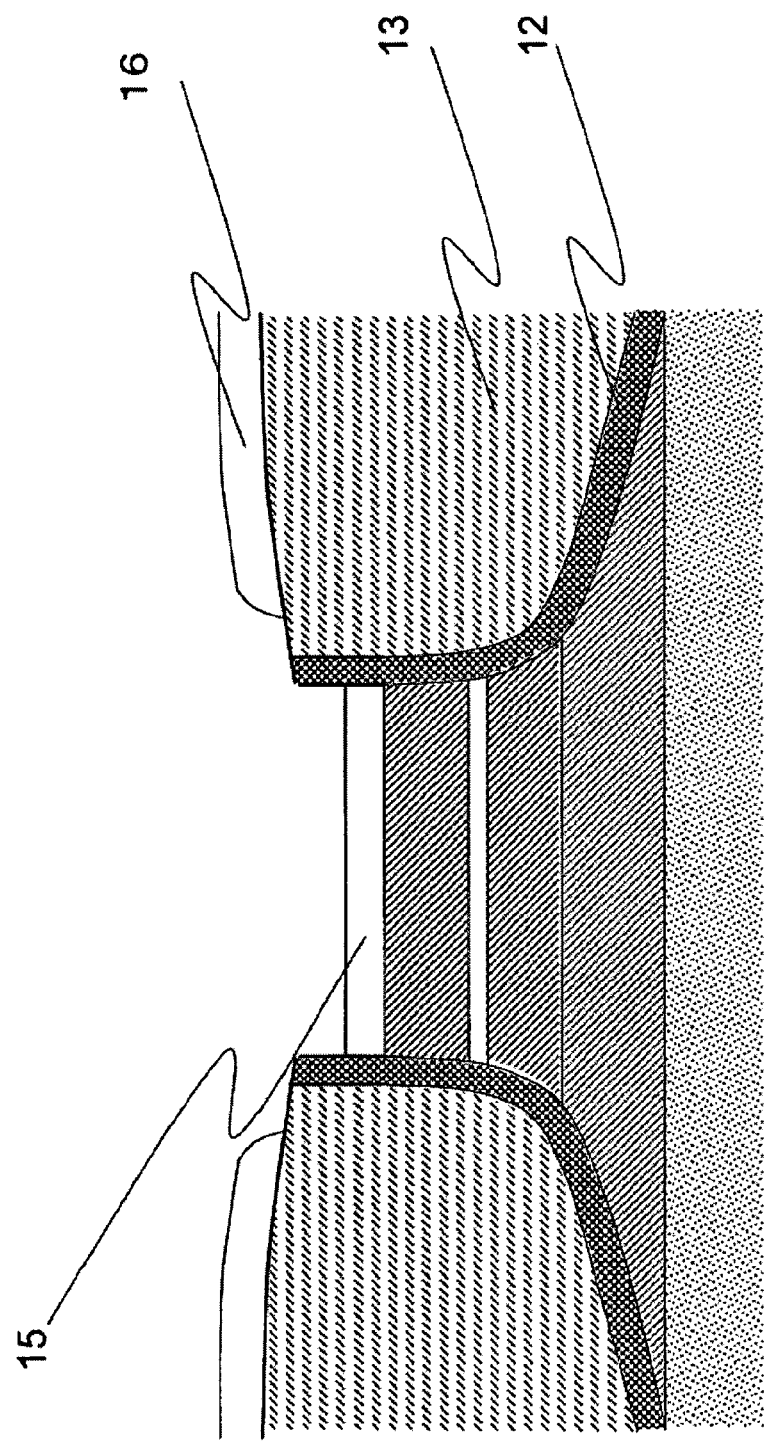
FIG. 13 illustrates the CPP-type magnetoresistive element during the execution of the lift-off process using CMP according to conventional art, as viewed from the air-bearing surface.
Figure 14:
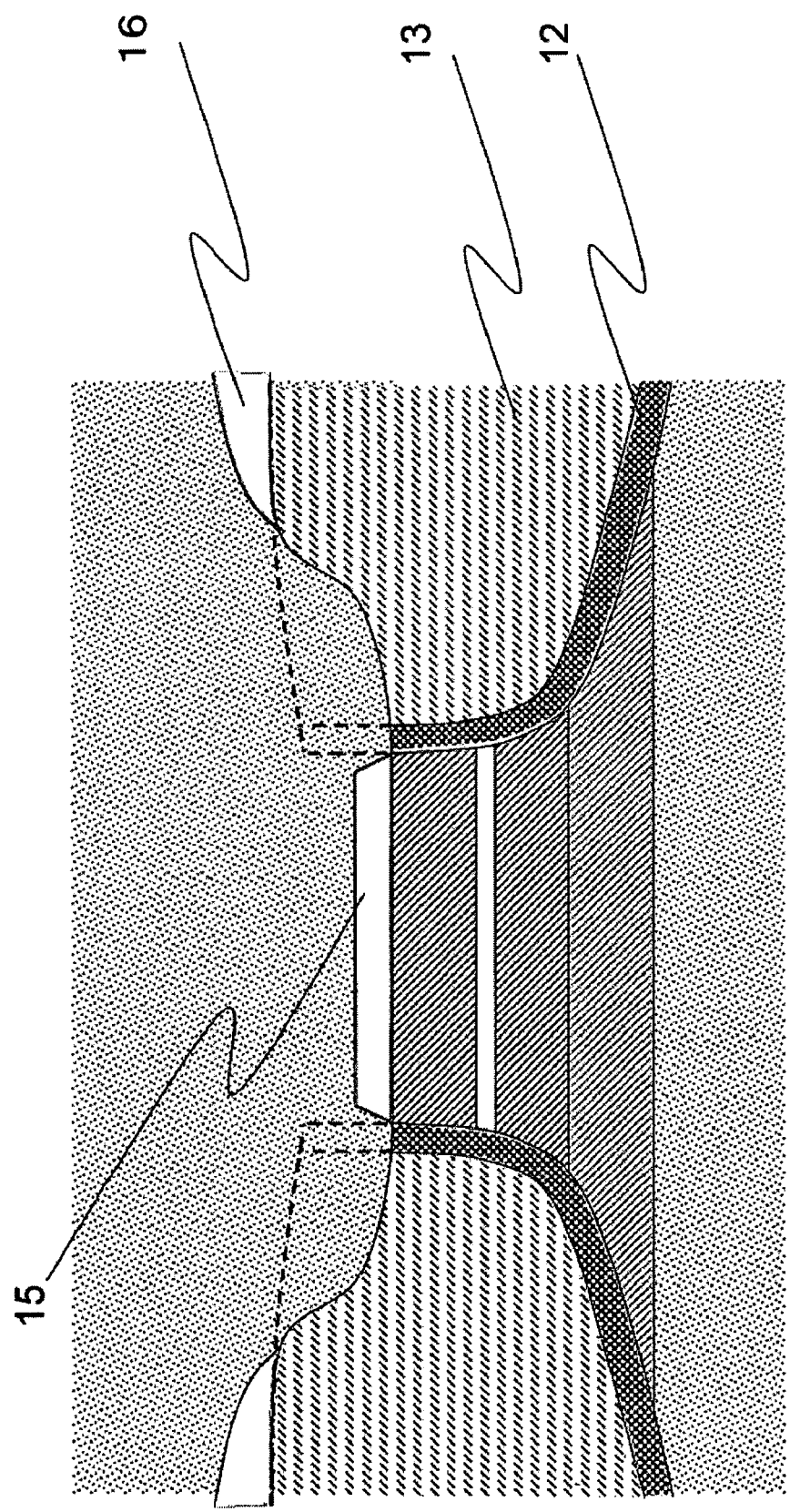
FIG. 14 illustrates the CPP-type magnetoresistive element after the execution of the lift-off process using CMP according to the conventional art, as viewed from the air-bearing surface.

FIG. 10 illustrates a CPP-type magnetoresistive effect head according to further modification of the second embodiment as viewed from the air-bearing surface. This modification is structured to omit the magnetic shield underlayer film 19 from the structure shown in FIG. 9. In addition to the effect of the second embodiment, this structure can increase the film thickness of the magnetic domain control layer 13 and reduce the distance (Gs) between the upper and lower magnetic shield layers.

With the embodiments and their modifications according to the present invention as described above, the side wall protection film is disposed on the side wall of the refill insulation film protruding from the CPP-type magnetoresistive effect film. This suppresses the scrape of the magnetic domain control layer resulting from the lift-off process using CMP to increase the film thickness of the magnetic domain control layer close to the device, which enhances a bias magnetic field applied to the free layer, thereby providing stable read output.

What is claimed is:

1. A CPP-type magnetoresistive effect head comprising:
   a lower magnetic shield layer;
   a magnetoresistive effect film including an antiferromagnetic layer, a pinned layer made of alloy containing a ferromagnetic material, an intermediate layer made of a nonmagnetic material and a free layer made of alloy containing a ferromagnetic material which are laminated on top of the lower magnetic shield layer;
   a refill insulation film and a magnetic domain control layer formed on both sides of the magnetoresistive effect film to protrude from an upper surface of the magnetoresistive effect film;
   a side wall protection film formed on a side wall of the refill insulation film and on top of the magnetoresistive effect film so as to define the height of the magnetic domain control layer; and
   an upper magnetic shield layer formed on top of the magnetoresistive effect film and the magnetic domain control layer.

2. The CPP-type magnetoresistive effect head according to claim 1, wherein the side wall protection film is made of a single material selected from the group consisting of Co, Cr, Mo, Hf, Ir, Nb, Re, Rh, Ru, and W, or a composite material containing the materials.

3. the CPP-type magnetoresistive effect head according to claim 1, wherein the side wall protection film, the refill insulation layer and the magnetic domain control layer have almost the same height.

4. The CPP-type magnetoresistive effect head according to claim 1, wherein a bottom portion of the refill insulation film is located at a position corresponding to the intermediate layer of the magnetoresistive effect head.

5. The CPP-type magnetoresistive head according to claim 1, wherein a bottom portion of the refill insulation film is located at a position corresponding to the antiferromagnetic layer of the magnetoresistive effect film.

6. The CPP-type magnetoresistive effect head according to claim 1, wherein a nonmagnetic underlayer film is formed between the upper surfaces of the magnetoresistive effect film and the magnetic domain control layer and the upper magnetic shield layer.

7. A CPP-type magnetoresistive effect head comprising:
   a lower magnetic shield layer;
   a magnetoresistive effect film including an antiferromagnetic layer, a pinned layer made of alloy containing a ferromagnetic material, an intermediate layer made of a nonmagnetic material and a free layer made of alloy containing a ferromagnetic material which are laminated on top of the lower magnetic shield layer;
   a refill insulation film and a magnetic domain control layer formed on both sides of the magnetoresistive effect film to protrude from a top surface of the magnetoresistive effect film;
   a side wall protection film formed on a side wall of the refill insulation film and on top of the magnetoresistive effect film so as to define the height of the magnetic domain control layer;
   a gap layer formed on top of the magnetoresistive effect film; and
   an upper magnetic shield layer formed on top surfaces of the gap layer and the magnetic domain control layer.

8. The CPP-type magnetoresistive effect head according to claim 7, wherein the gap layer is made of a nonmagnetic material.

9. The CPP-type magnetoresistive effect head according to claim 7, wherein the gap layer is made of a single material selected from the group consisting of Co, Cr, Mo, Hf, Ir, Nb, Re, Rh, Ru, and W, or a composite material containing the materials.

10. A method of manufacturing a CPP-type magnetoresistive effect head, the method comprising the steps of:
   forming a lower electrode and lower magnetic shield layer on top of a substrate;
   forming, on top of the lower electrode and lower magnetic shield layer, a magnetoresistive effect film by laminating an antiferromagnetic layer, a pinned layer made of alloy containing a ferromagnetic material, an intermediate layer made of a nonmagnetic material and a free layer containing alloy containing a ferromagnetic material;

forming a metal film on top of the magnetoresistive effect film;
forming a first CMP stopper film on the metal film;
forming a resist pattern on the first CMP stopper film;
patterning the first CMP stopper film using the resist pattern as a mask;
sputtering the metal film by an ion beam sputtering method to form a side wall protection film on side walls of the first CMP stopper film patterned and the resist pattern;
patterning the magnetoresistive effect film by milling;
forming a refill insulation film and a magnetic domain control layer on both sides of the magnetoresistive effect film patterned;
forming a second CMP stopper film on the magnetic domain control layer;
removing the resist pattern and the refill insulation film and the magnetic domain control layer deposited on the resist pattern by chemical mechanical polishing (CMP);
removing the first CMP stopper film and the second CMP stopper film; and
forming an upper electrode and upper magnetic shield layer.

11. The method of manufacturing a CPP-type magnetoresistive effect head according to claim 10, wherein the metal film is made of a single material selected from the group consisting of Co, Cr, Mo, Hf, Ir, Nb, Re, Rh, Ru, and W, or a composite material containing the materials.

12. The method of manufacturing a CPP-type magnetoresistive effect head according to claim 10, wherein each of the first CMP stopper film and the second CMP stopper film is a DLC film.

13. The method of manufacturing a CPP-type magnetoresistive effect head according to claim 10, wherein the first CMP stopper film and the second CMP stopper film are each made of a single material selected from the group consisting of Co, Cr, Mo, Hf, Ir, Nb, Re, Rh, Ru, and W, or a composite material containing the materials.

14. The method of manufacturing a CPP-type magnetoresistive effect head according to claim 10, further comprising the step of forming a nonmagnetic underlayer before the step of forming the upper electrode and upper magnetic shield layer.

* * * * *

UNITED STATES PATENT AND TRADEMARK OFFICE
CERTIFICATE OF CORRECTION

PATENT NO. : 7,944,651 B2
APPLICATION NO. : 12/006723
DATED : May 17, 2011
INVENTOR(S) : Masahiro Ousugi et al.

Page 1 of 1

It is certified that error appears in the above-identified patent and that said Letters Patent is hereby corrected as shown below:

In Background of the Invention:

Column 1, Line 41, please insert --11-- after film;
Column 2, Line 23, please delete "I" and insert --1-- therefor;
Column 3, Line 42, please delete "thing" and insert --thin-- therefor;
Column 3, Line 50, please delete "filed" and insert --field-- therefor;

In Brief Summary of the Invention:

Column 4, Line 3, please delete "13" and insert --31-- therefor;

In Brief Description of the Invention:

Column 7, Line 12, please delete "II" and insert --11-- therefor;
Column 7, Line 59, please delete "CPM" and insert --CMP-- therefor;
Column 9, Line 6, please delete "25" and insert --15-- therefor;
Column 9, Line 20, please delete "25" and insert --15-- therefor;
Column 9, Line 22, please delete "25" and insert --15-- therefor;

In Claims:

In Claim 3, Column 10, Line 13, please delete "the" and insert --The-- therefor.

Signed and Sealed this
Twentieth Day of March, 2012

David J. Kappos
*Director of the United States Patent and Trademark Office*